United States Patent [19]

Murakami et al.

[11] Patent Number: 5,671,764
[45] Date of Patent: Sep. 30, 1997

[54] WASHING APPARATUS, AND WASHING METHOD

[75] Inventors: Shinya Murakami, Kumamoto-ken; Yuuji Kamikawa, Uto; Sinichiro Izumi, Kumamoto; Noriyuki Anai; Takami Satoh, both of Kumamoto-ken; Hirofumi Shiraishi, Kurume; Koji Harada; Takayuki Tomoeda, both of Kumamoto-ken; Hiroshi Tanaka, Kurume, all of Japan

[73] Assignees: Tokyo Electron Limited, Tokyo; Tokyo Electron Saga Limited, Tosu, both of Japan

[21] Appl. No.: 560,708

[22] Filed: Nov. 20, 1995

Related U.S. Application Data

[62] Division of Ser. No. 880,068, May 7, 1992, Pat. No. 5,488,964.

[30] Foreign Application Priority Data

| May 8, 1991 | [JP] | Japan | 3-131673 |
| May 13, 1991 | [JP] | Japan | 3-135301 |
| May 13, 1991 | [JP] | Japan | 3-135303 |

[51] Int. Cl.⁶ ........................... B08B 15/00
[52] U.S. Cl. ........................... 134/200; 134/902
[58] Field of Search ............... 134/104.1, 200, 134/902; 118/70

[56] References Cited

U.S. PATENT DOCUMENTS

| 4,132,567 | 1/1979 | Blackwood | 134/200 |
| 4,316,750 | 2/1982 | Gengler | 134/104.1 |
| 4,575,299 | 3/1986 | Layton et al. | 134/902 |
| 4,664,133 | 5/1987 | Silvernail et al. | 134/902 |
| 4,674,521 | 6/1987 | Paulfus | 134/902 |
| 4,693,777 | 9/1987 | Hazano et al. | 134/902 |
| 4,714,086 | 12/1987 | Kishida et al. | 134/902 |
| 4,871,417 | 10/1989 | Nishizawa et al. | 134/902 |
| 5,095,925 | 3/1992 | Ellidge et al. | 134/109.1 |

*Primary Examiner*—Frankie L. Stinson
*Attorney, Agent, or Firm*—Oblon, Spivak, McClelland, Maier & Neustadt, P.C.

[57] ABSTRACT

Disclosed herein is a washing apparatus comprising a washing chamber, an opening/closing mechanism, and a nozzle. The chamber has an opening and is designed for washing the objects transported from outside through the opening. The opening/closing mechanism is designed to open and close the opening of the washing chamber. The nozzle is used to wash the opening/closing mechanism. The apparatus further comprises a washing vessel filled with a washing liquid, for washing the objects, and also a nozzle for applying a washing liquid to the objects located in the washing vessel when the objects are partly exposed as the washing liquid is discharged from the washing vessel.

15 Claims, 17 Drawing Sheets

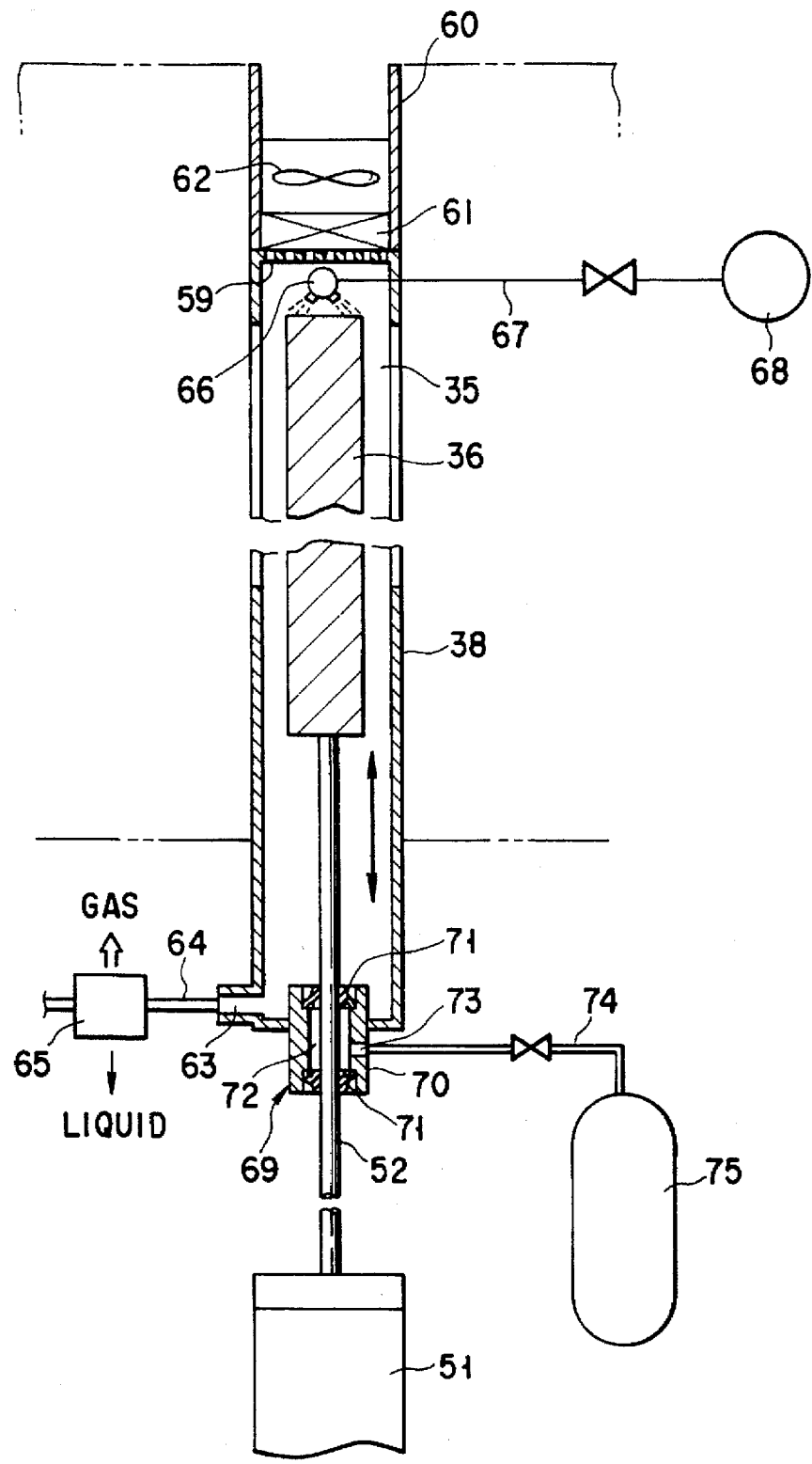
F I G. 5

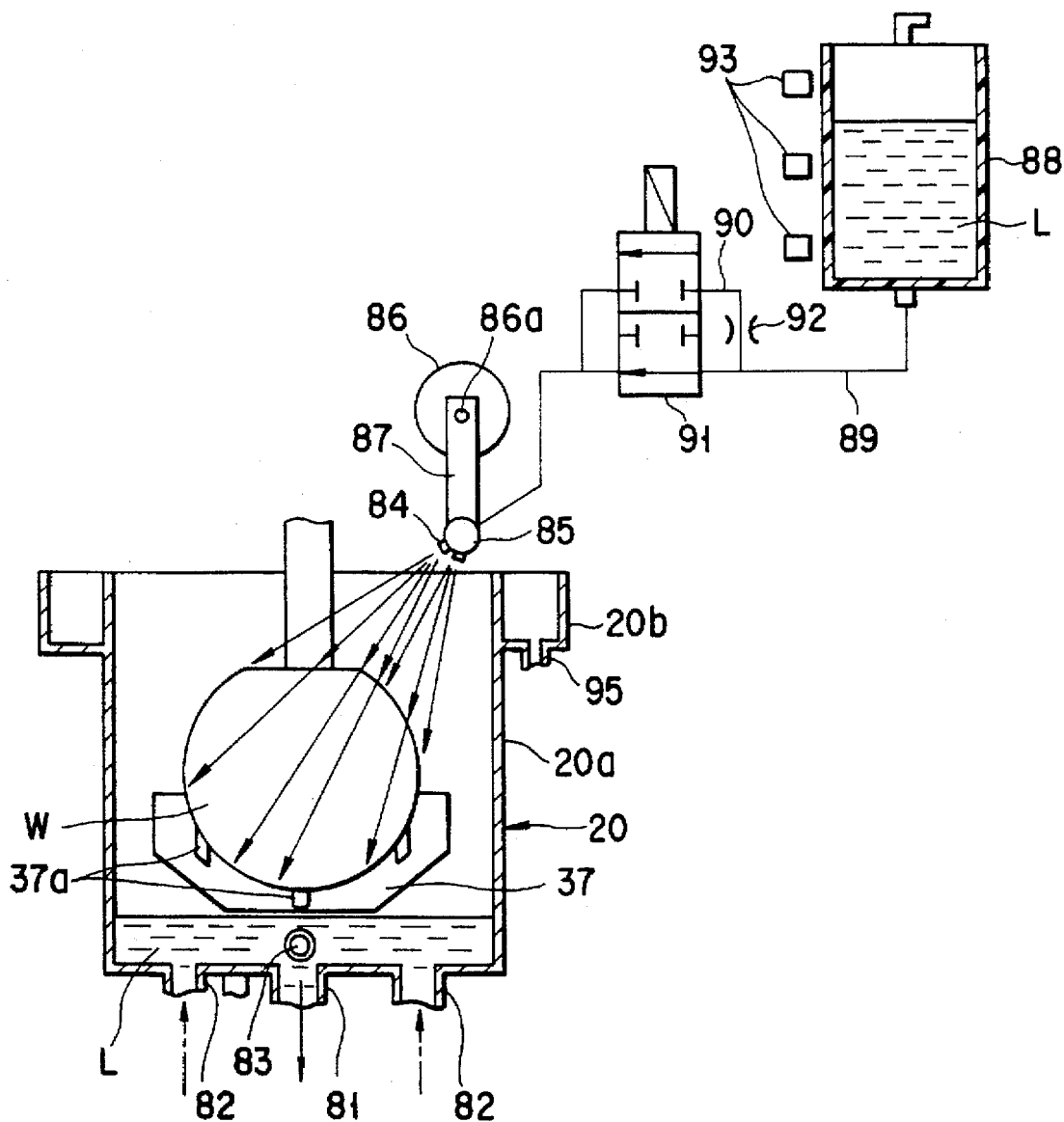
F I G. 6

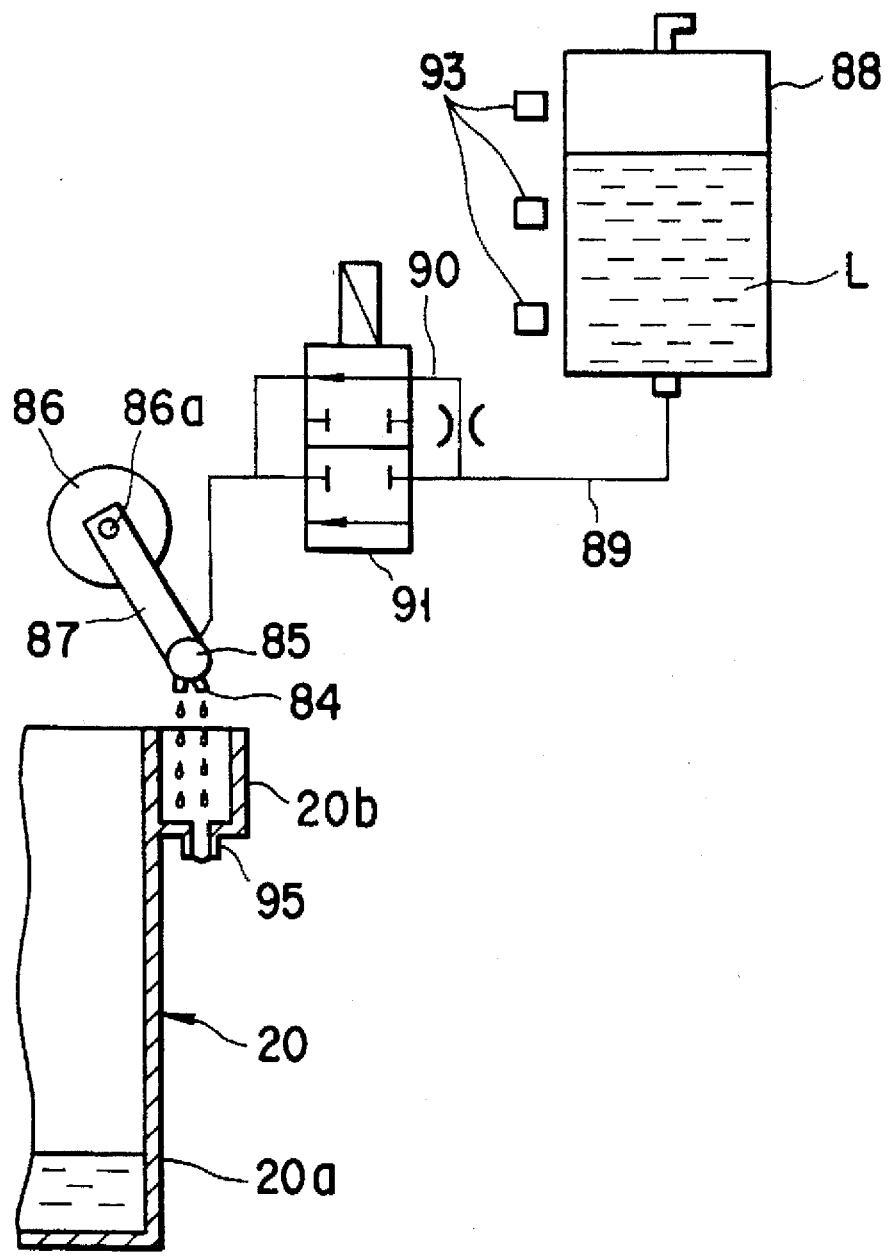
F I G. 7

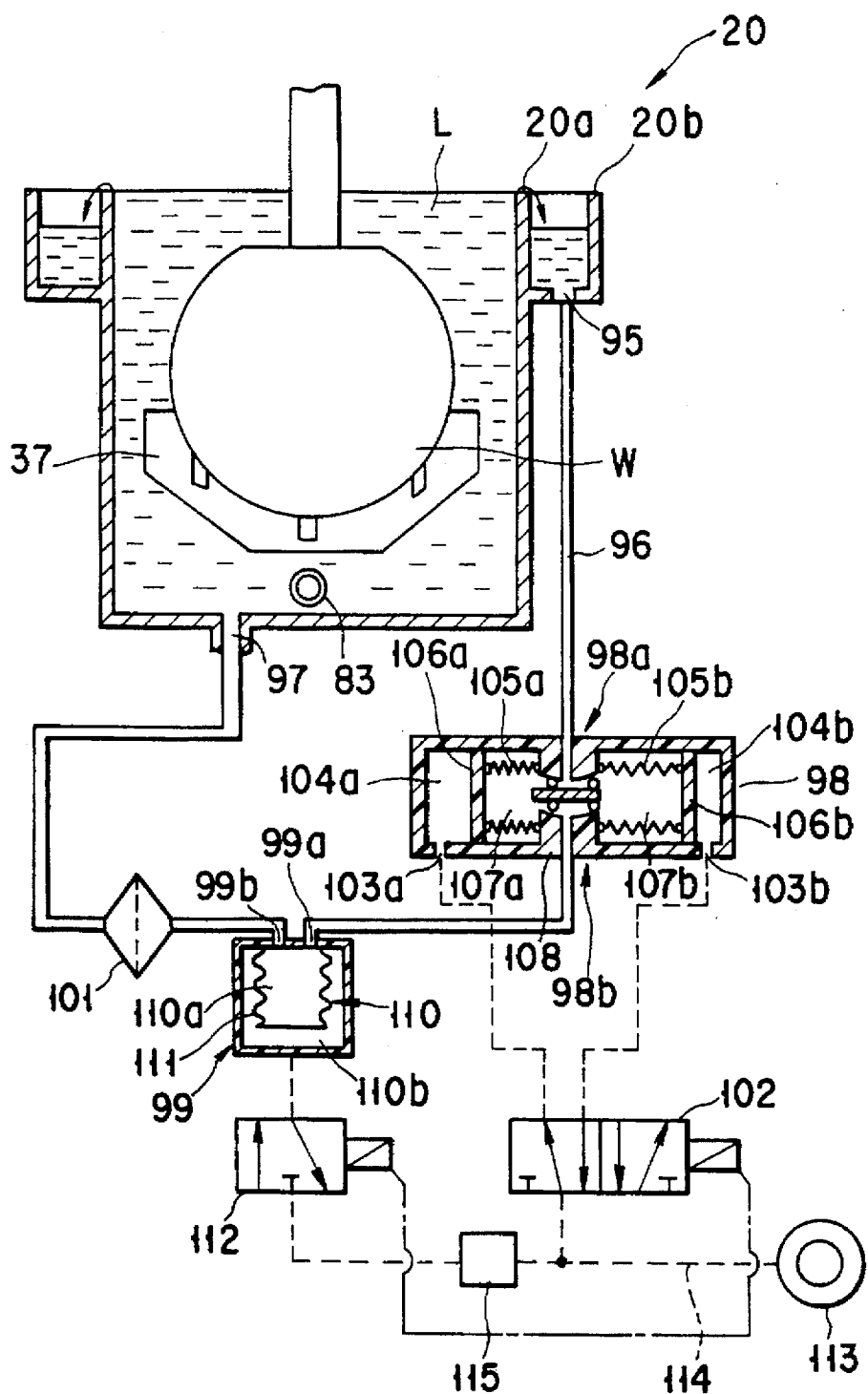
F I G. 9

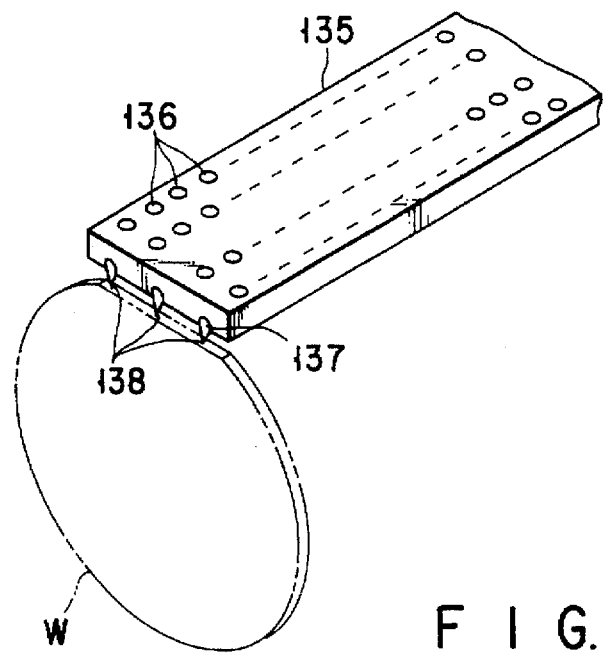
F I G. 13
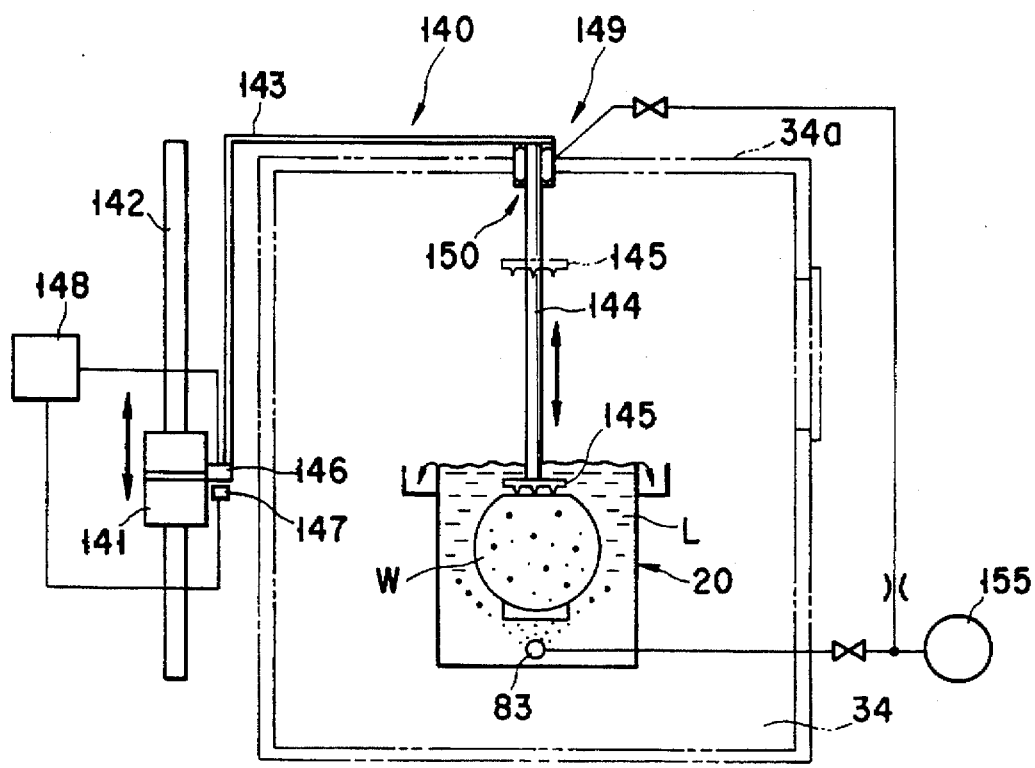
F I G. 14

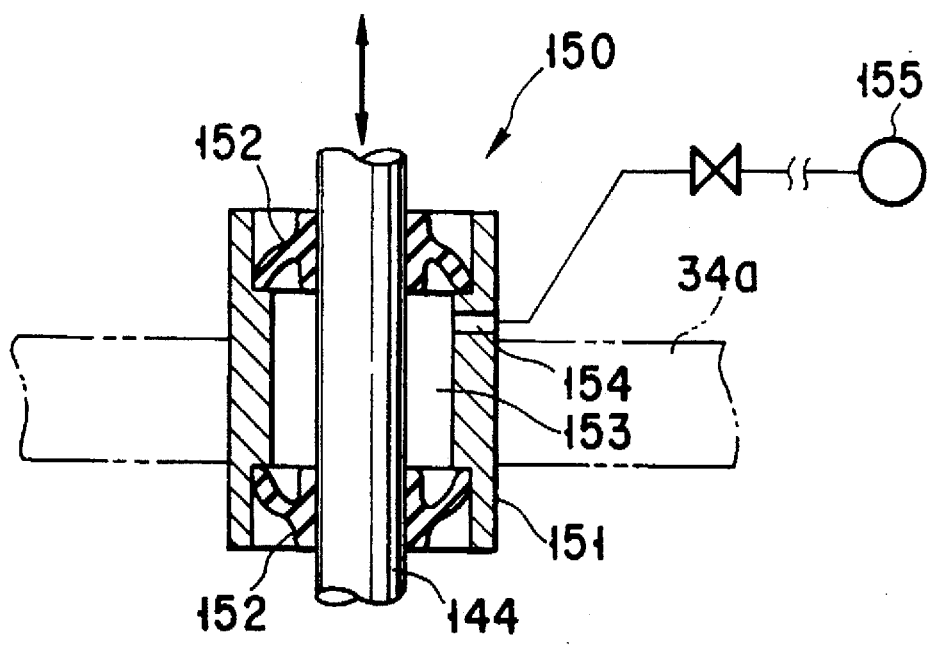
F I G. 15

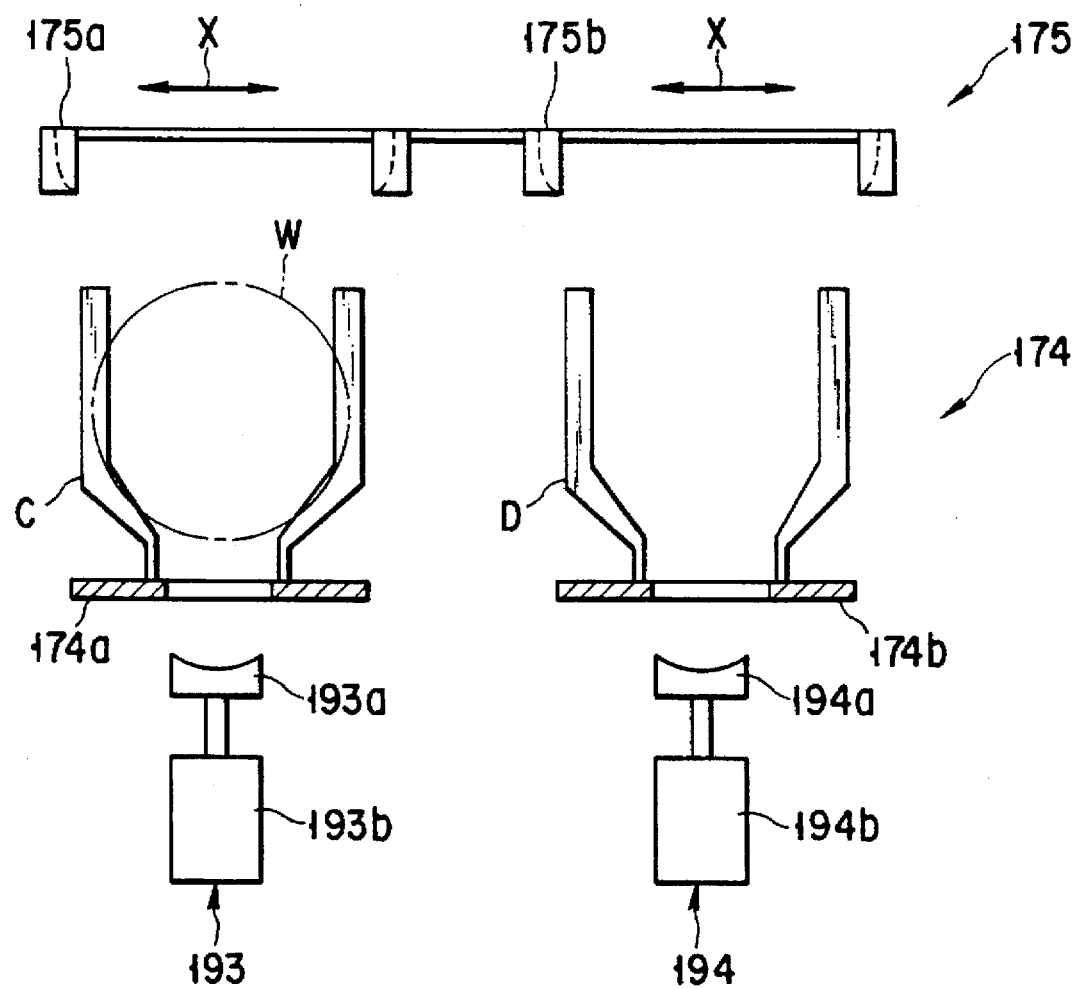
F I G. 18

WASHING APPARATUS, AND WASHING METHOD

This is a Division of application Ser. No. 07/880,068, filed on May 7, 1992, now U.S. Pat. No. 5,488,964.

BACKGROUND OF THE INVENTION

1. Field of the Invention

The present invention relates to an apparatus and a method of washing objects such as semiconductor wafers.

2. Description of the Related Art

In the manufacture of semiconductor devices, semiconductor wafers are washed by washing machines, whereby process solutions, impurities, and the like are removed from the wafers. A washing apparatus of this type washes wafers with ammonia water, with water, and with fluoric acid, thereby cleaning the surfaces of the wafers.

Some problems are inherent in the washing apparatus. First, the liquid in which a wafer has been washed with remains on the surface of the wafer when the wafer is washed with another solution, making it difficult to wash the wafer thoroughly. Second, the washing liquids, for example, ammonium and fluoric acid, react with each other, forming salt which eventually remain in the form of particles on the surface of the wafer and inevitably reduces the yield of semiconductor devices. Third, when the wafer comes out of contact with any washing liquid and is exposed to air, it is dried and may have a stain on its surface, which will impair the outer appearance of the wafer and degrade the electric characteristic thereof.

Generally it is desirable that each washing liquid be maintained pure and clean in order to increase the washing efficiency. To this end, the washing liquid discharged from the washing tank is passed through a filter, thereby removing impurities or other liquid as much as possible, and the washing liquid thus cleaned is supplied back into the tank and used again, as is disclosed in Published Unexamined Japanese Patent Application No. 62-94939. The filtration, however, cannot clean the washing liquid completely.

SUMMARY OF THE INVENTION

An object of this invention is to provide a washing apparatus, wherein neither a residual washing liquid nor particles remain on semiconductor wafers when the wafers are washed, thereby maintaining a high yield of semiconductor devices.

Another object of the invention is to provide a washing apparatus and a washing method which can prevent objects from being stained and can keep washing liquid clean.

In an aspect of the invention, there is provided a washing apparatus comprising a washing chamber having an opening and designed for washing the objects transported from outside through the opening, opening/closing means for opening and closing the opening of the washing chamber, and washing means for washing the opening/closing means.

In another aspect of the invention, there is provided a washing apparatus comprising a washing vessel for containing a washing liquid and designed to wash objects with the washing liquid, liquid-discharging means provided in the washing vessel, and liquid-applying means for applying the washing liquid to the objects located in the washing vessel when the objects are partly exposed as the liquid-discharging means discharges the liquid from the washing vessel.

In still another aspect of the invention, there is provided a washing method comprising the steps of: supplying a washing liquid to a washing vessel, immersing objects in the washing liquid contained in the washing vessel, discharging the liquid at least once from the washing vessel, and applying the washing liquid to the objects when the objects are at least partly exposed as the liquid is discharged from the washing vessel.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is an enlarged cross-sectional view of the boundary between the washing section and the transport section;

FIG. 6 is a cross-sectional view showing a washing tank equipped with a liquid-jetting mechanism;

FIG. 7 is a diagram showing the liquid-jetting mechanism located at its retreated position;

FIG. 9 is a schematic view showing the liquid-circulating system used in the washing apparatus;

FIG. 13 is a diagram illustrating a floating-preventing member of another type which can be used in the mechanism of FIG. 11;

FIG. 14 is a diagram showing a mechanism of another type for preventing wafers from floating;

FIG. 15 is a cross-sectional view showing the seal mechanism used in the mechanism of FIG. 14;

FIG. 18 is a diagram explaining how the transport unit handles semiconductor wafers.

DETAILED DESCRIPTION OF THE PREFERRED EMBODIMENTS

An washing apparatus according to this invention will now be described, with reference to the accompanying drawings.

Figure 1:
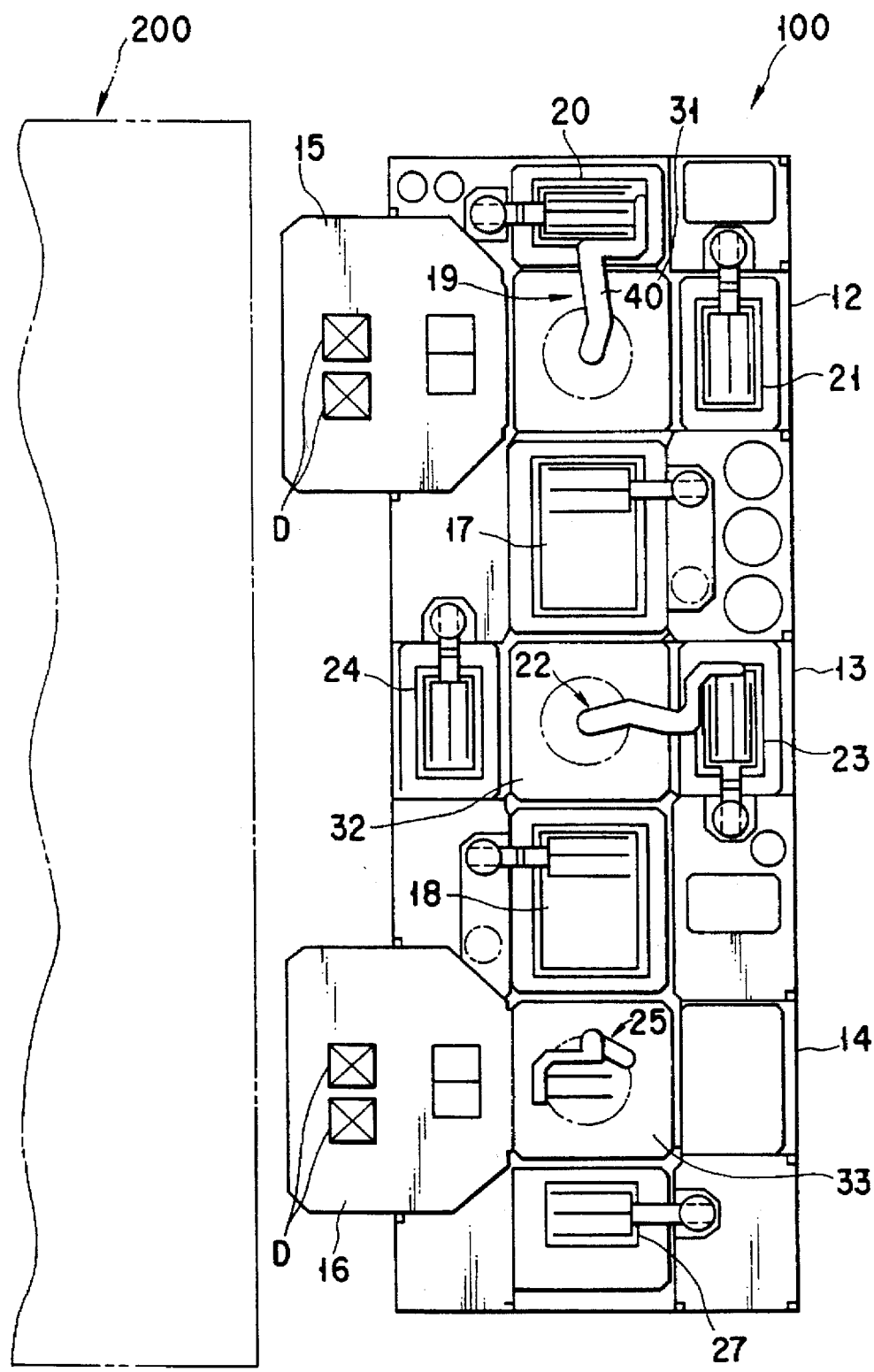
FIG. 1 is a layout showing a washing system to which this invention is applied.

FIG. 1 is a layout of a washing system which incorporates the washing apparatus. The system comprises a washing unit 100 and a transport unit 200. The unit 100 is designed to wash semiconductor wafers, and the unit 200 to transport wafers into and out of the washing unit 100.

The washing unit 100 comprises washing sections 12, 13, and 14 which are arranged in a straight line in the order mentioned. The first washing section 12 has a loader 15 for loading semiconductor wafers. The loader 15 has a stage for holding two carriers D each capable of holding at most 25 wafers. The carriers D containing wafers, which are to be washed, are transported to the loader 15 and placed on the stage, at prescribed positions, by means of a robot (not shown).

The third washing unit 14 has an unloader 16 for unloading semiconductor wafers. The unloader 16 has a stage for holding the carriers D. The carriers D containing wafers, which have been washed, are transported from the unloader 16 to the transport unit 200 by means of the robot (not shown).

The first washing section 12 further has a transport chamber 31, an underwater loader 17, and two washing tanks 20 and 21. The chamber 31 is located in the center part of the section 12 and beside the loader 15. The underwater loader 17 and the washing tanks 20 and 21 are arranged on the three sides of the transport chamber 31. The chamber 31 contains a transport mechanism 19 having a multi-joint arm 40. The mechanism 19 has a base connected to the shaft of a stepping motor (not shown). Hence, when the base is driven by the motor, the arm 40 rotates and expands or contracts to move semiconductor wafers into and out of the underwater loader 17 and the washing tanks 20 and 21.

The washing tank 20 is filled with water, and the washing tank 21 is filled with, for example, ammonia water. The tank 20 is used to achieve so-called "quick damp rinse (QDR)," i.e., water-washing for removing ammonia from wafers. The underwater loader 17 is located beside the second washing section 13 and is filled with water, for temporarily holding wafers supplied from the tank 20 by the transport mechanism 19. The semiconductor wafers are transported to the second washing section 13 through underwater loader 17.

The second washing section 13 comprises a transport chamber 32, an underwater loader 18, and two washing tanks 23 and 24. The chamber 32 is located in the center part of the section 13 and beside the underwater loader 17 of the first washing section 12. The underwater loader 18 and the washing tanks 23 and 24 are arranged on the three sides of the transport chamber 32. The chamber 32 contains a transport mechanism 22 having a multi-joint arm 40. The mechanism 22 is identical to the mechanism 19 in the transport chamber 31 of the first washing section 12, and designed to move semiconductor wafers into and out of the underwater loaders 17 and 18 and the washing tanks 23 and 24.

The washing tank 23 is filled with, for example, fluoric acid, and the washing tank 24 is filled with water. The tank 24 is used as a so-called "water-washing overflow tank," for removing fluoric acid from the wafers moved from the washing tank 23. The underwater loader 18 is located beside the third washing section 14 and is filled with water, for temporarily holding wafers supplied from the tank 24 by the transport mechanism 22. The semiconductor wafers are transported to the third washing section 14 through underwater loader 18.

The third washing section 14 comprises a transport chamber 33 and a drying tank 27. The transport chamber 33 is located in the center part of the section 13 and beside the underwater loader 18 of the second washing section 13. It contains a transport mechanism 25 having a multi-joint arm 40. The mechanism 25 is identical to the mechanism 19 in the transport chamber 31 of the first washing section 12, and designed to move semiconductor wafers into and out of the underwater loader 18 and the drying tank 27. The drying tank 27 is used to perform IPA (isoproplyl alcohol) drying on the wafers which the mechanism 25 transports from the underwater loader 18 of the second washing section 13.

Figure 2:
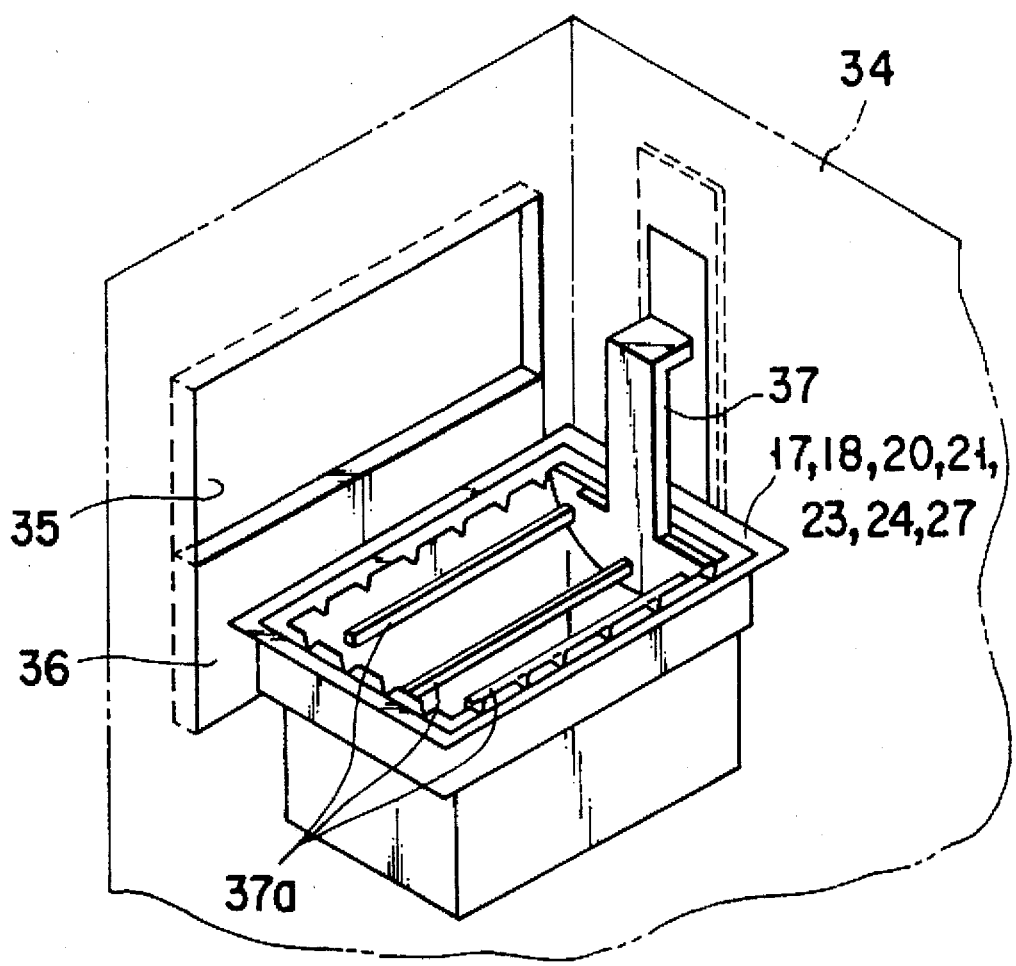
FIG. 2 is a perspective view showing a washing tank incorporated in a washing apparatus according to the invention.

The underwater loaders 17 and 18, the washing tanks 20, 21, 23 and 24, and the drying tank 27 have essentially the same structure shown in FIG. 2. As is shown in FIG. 2, they are placed each within a process chamber 34. The chamber 34 has a window 35 through which to move wafers in and out, and a shutter 36 for opening and closing the window 35. The loaders 17 and 18, the washing tanks 20, 21, 23 and 24, and the drying tank 27 have a wafer boat 37 and an elevator mechanism (not shown) each.

The wafer boat 37 is made of quartz and can be moved up and down by the elevator mechanism. It has three parallel rods 37a. The rods 37a have grooves spaced apart at predetermined intervals and can support at most 50 wafers W, such that the wafers W are held vertically, each having its lower edge fitted in the corresponding grooves of the parallel rods 37a.

Figure 3:
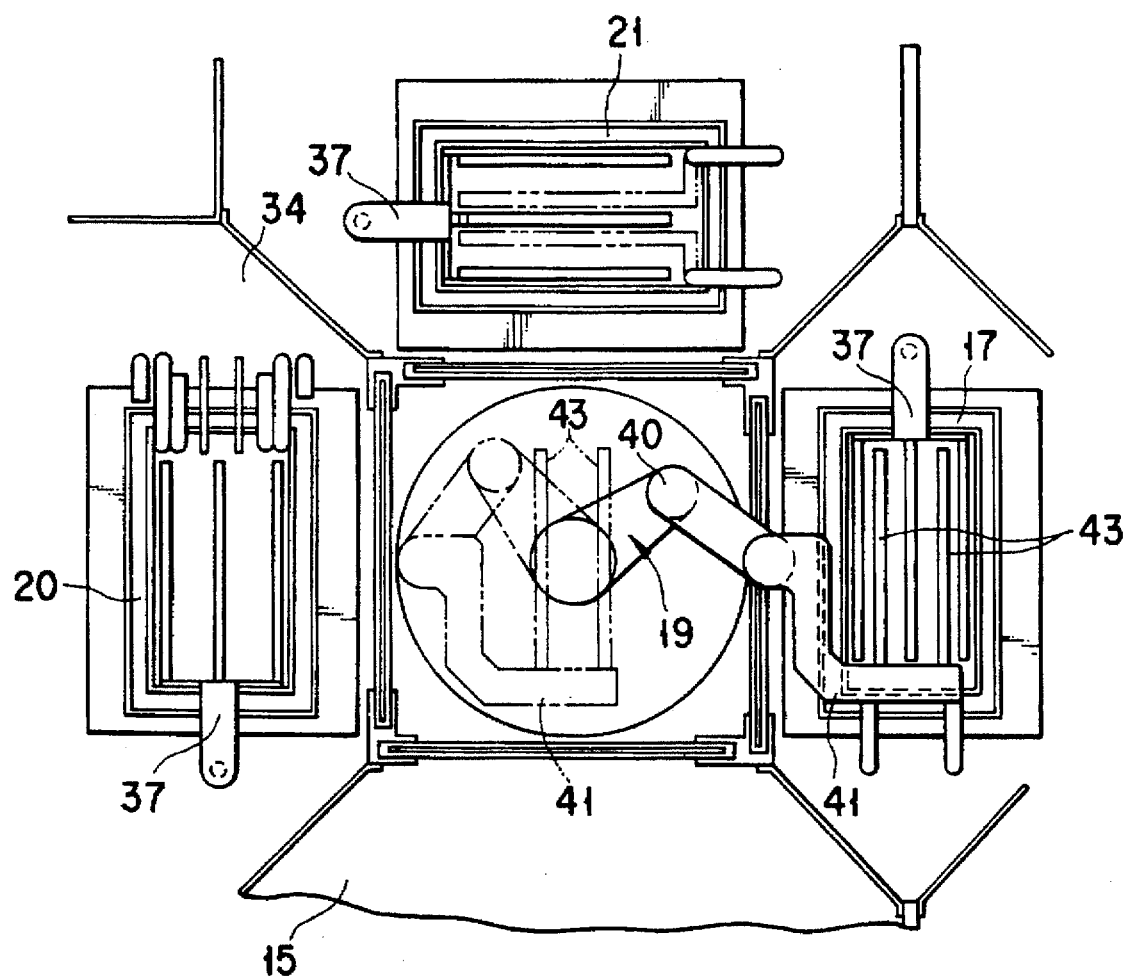
FIG. 3 is a plan view of the washing section of the washing apparatus.

As is shown in FIG. 3, the multi-joint arm 40 of the transport mechanism 19 can rotate, expand and contract in a horizontal plane. The arm 40 has a fork 41 attached to its free end. The fork 41 has a pair of support rods 43 which extend parallel to each other and which have grooves spaced apart at predetermined intervals. These rods 43 can support semiconductor wafers W, such that the wafers W are held vertically, each having its lower edge fitted in the corresponding grooves of the rods 43. The fork 41 can move and be located right above the tanks 17, 20 and 21 when the multi-joint arm 40 is rotated and expanded. To transfer the wafers W from the fork 41 onto the wafer boat 37, the support rods 43 of the fork 41 are placed among the parallel rods 37a of the wafer boat 37, and the wafer boat 37 is moved up. To transfer the wafers W from the wafer boat 37 to the fork 41, the support rods 43 of the fork 41 are placed among the parallel rods 37a of the wafer boat 37, and the wafer boat 37 is moved down.

It is desirable that the rods 37a and 43 be made of material which is soft and anti-corrosion, such as fluorine-series resins. If the wafers W have been washed with a strong-acid or strong-alkali liquid, the rods 37a and 43 should be made of ethylene fluoride resins, preferably tetrafluoroethylene resin or trifluoroethylene resin. If the wafers W have been washed with a weak-acid or weak-alkali liquid, the rods 37a and 43 should be made of vinylidene fluoride resin.

Figure 4:
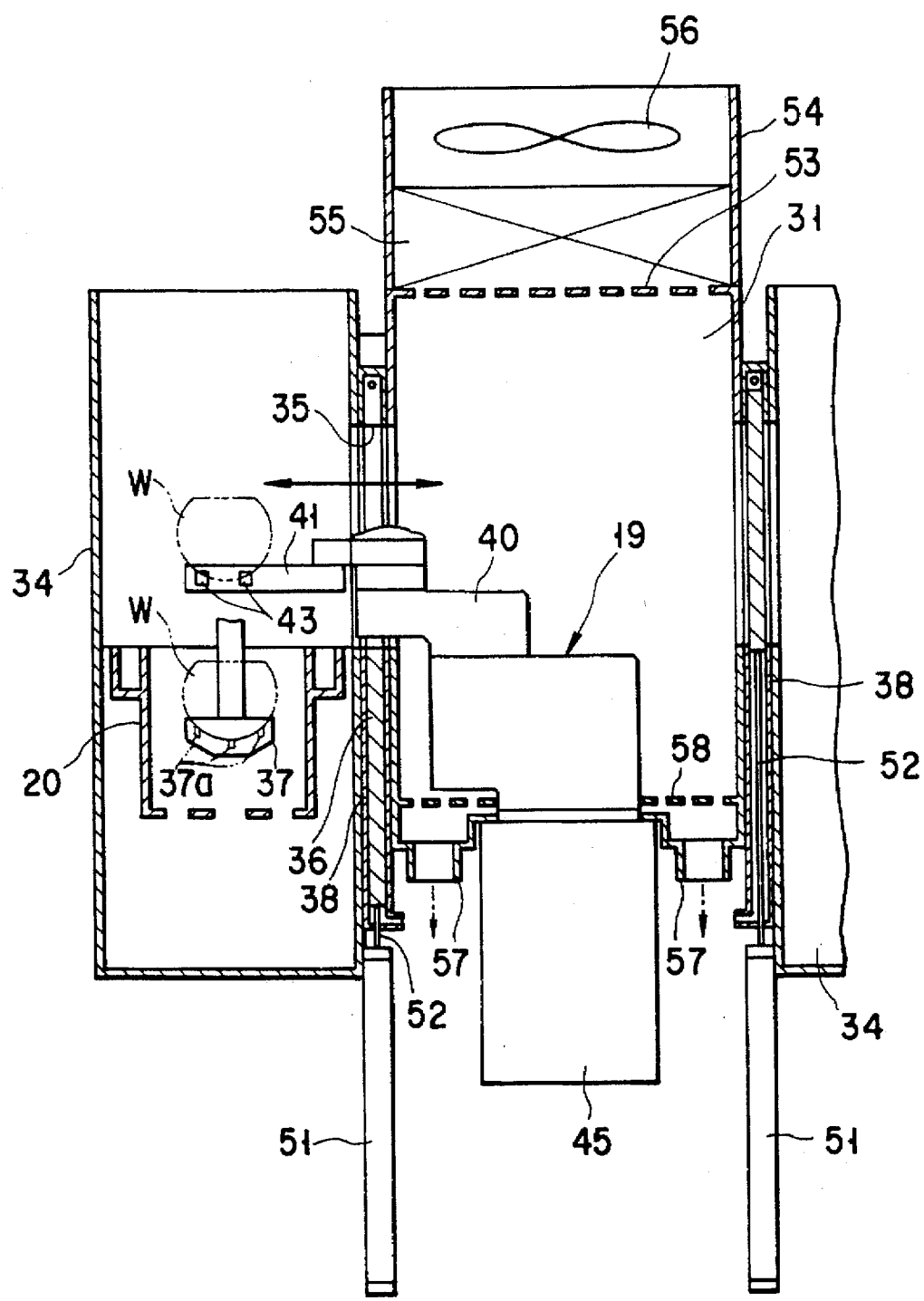
FIG. 4 is a cross-sectional view illustrating the boundary between the washing section and transport section of the apparatus.

The first washing section 12 will now be described in greater detail, with reference to FIG. 4 which is a cross-sectional view showing the the transport chamber 31 and the process chamber 34 containing the washing tank 20.

The process chamber 34 communicates with the chamber 31 via the window 35. The shutter 36, designed to open and close the window 35, is made of anti-chemical material such as quartz glass, slidably inserted in a case 38 attached to the process chamber 34 and located at the window 35, and can be moved up and down. The case 38 is made of water-proof and anti-corrosion material such as vinyl chloride.

As is evident from FIG. 4, the shutter 36 is coupled to the plunger 52 of an air cylinder 51 which is located below the case 38 and used as means for driving the shutter 36. The shutter 36 is moved up to close the window 35, when the plunger 36 is moved outwards. The shutter 36 is moved down to open the window 35, when the plunger 36 is moved inwards.

In the transport chamber 31, the multi-joint arm 40 of the transport mechanism 19 is driven by the stepping motor 45. As has been described, the fork 41 rotatably attached to the free end of the arm 40 moves the wafers W into and out of the chamber 34.

A plate 53 having a number of holes is arranged above the transport chamber 31. A duct 54 is connected to the plate 53. In the duct 54, an HEPA filter 55 is fixed, and an air-supplying fan 56 is located above the HEPA filter 55. The bottom of the transport chamber 31 has two ports 57 through which to discharge air and liquid. A plate 58 having holes is fixed in the chamber 31, right above the bottom thereof, for controlling the flow of air and liquid. A fan (not shown) is provided in either port 57, for promoting the discharge of air and liquid.

When the air-supplying fan 56 and the fans (not shown) set in the ports 57 are driven, cleaned air is supplied into the transport chamber 31, flows downwards in the form of a layer, passing through the chamber 31, and is discharged from the chamber 31 through the ports 57 made in the bottom of the chamber 31. Hence, the atmosphere in the chamber 31 remains clean.

The other transport chambers 32 and 33 of the washing unit 100 have structures similar to that of the transport chamber 31. In these chambers 32 and 33, too, clean air flows downwards, maintaining the atmosphere in the chambers 32 and 33 clean.

FIG. 5 is an enlarged cross-sectional view of the boundary between the transport chamber 31 and the process chamber 34. As is shown in this figure, an air-supplying plate 59 having a number of small holes is fitted in the upper end of the case 38, and a duct 60 is connected to the upper end of the case 38. The duct 60 contains a an HEPA filter 61 and an air-supplying fan 62. The filter 61 is mounted on the air-supplying plate 59. The fan 62 is located above the filter 61. The lower end of the case 38 has a port 63 for discharging air and liquid from the case 38. A discharge pipe 64 is connected to the port 63 at one end, and to a suction means (not shown) at the other.

When the air-supplying fan 62 and the suction means are driven, clean air flows into the case 38 through the air-supplying plate 59, downwards through the case 38, and out of the case 39 via the port 63, forming an air curtain in the case 38. Hence, the air leaking from the process chamber 34 and containing chemicals can be expelled outside from, for example, the clean room in which the washing system (FIG. 1) is installed.

As is shown in FIG. 5, an air-liquid separator 65 is mounted on the discharge pipe 64. The separator 65 separates the washing liquid and the gases generated in the process chamber 34 from the air discharged from the case 38. If necessary, an inert gas or $N_2$ gas can be supplied into the case 38 through the air-supplying plate 59.

A shower nozzle 66 is located in the upper-end portion of the case 38, more precisely right below the air-supplying plate 59. The nozzle 66 is connected to a pipe 67. The pipe 67 extends through the wall of the case 38 and is connected to a washing liquid tank 68 which is located outside the case 38. The tank 68 contains, for example, pure water. The pure water is supplied from the tank 68, and the shower nozzle 66 sprays the pure water onto the shutter 36 slidably inserted in the case 38, thereby removing chemicals and impurities from the shutter 36.

As is shown in FIG. 5, too, a seal mechanism 69 is fitted in the bottom of the case 38. The mechanism 69 comprises a hollow guide cylinder 70 and two seal members 71. The cylinder 70 penetrates the bottom of the case 38. The seal members 71 are inserted in the guide cylinder 70 and mounted on the plunger 52 of the air cylinder 51. The cylinder 70 is made of, for example, vinyl chloride, and the seal members 71 are made of, for example, synthetic rubber.

A sealed space 71 is formed within the guide cylinder 70 by virtue of the seal members 71. The cylinder 70 has an air hole 73. An $N_2$-supplying pipe 74 is connected to the air hole 73 at one end and to an $N_2$ tank 75 at the other end. $N_2$ gas is supplied into the sealed space 72 from the tank 75 through the pipe 74. Filled up with the $N_2$ gas, the space 72 is pressurized. Thus, the washing liquid is prevented from flowing into the air cylinder 51 along the plunger 52, to corrode the air cylinder 51. The air cylinder 51 can therefore have a prolonged lifetime.

Various operations are performed within the transport chamber 31, as will be explained as follows.

First, the plunder 52 is driven into the air cylinder 51. The shutter 36 is thereby moved downwards, opening the window 35 of the process chamber 34. Next, the multi-joint arm 40 of the transport mechanism 19 is driven, such that the fork 41 attached to the free end of the arm 40 transports the semiconductor wafers W into the process chamber 34. Meanwhile, clean air is applied downwards into the case 38 through the air-supplying plate 59, forming an air curtain. The air curtain prevents the external atmosphere from entering the process chamber 34 (i.e., the washing chamber). Now that the wafers W have been placed in the chamber 34, the arm 40 of the transport mechanism 19 is driven back into the transport chamber 31, and remains there until the wafers W are washed. As soon as the arm 40 is moved out of the process chamber 34, along with the fork 41, the air cylinder 51 is driven, thrusting the plunger 52 upwards. The shutter 36 is thereby moved up, closing the window 35 of the chamber 34. Hence, the atmosphere in the chamber 34 cannot leak outside at all.

In the meantime, the shower nozzle 66 applies the washing liquid onto the shutter 36, whereby the chemicals and impurities (e.g., fine particles of salt formed by the chemical reaction in the chamber 34) are removed from the shutter 36. The shutter 36 therefore remains clean at all times and causes no possibility of contaminating the atmosphere in the process chamber 34.

It is desirable that the shutter 36 be washed while the wafers W are being washed in the chamber 34 or while the shutter 36 is being moved up or down after the wafers W have been washed. Alternatively, the shutter can be washed while it stays in the lower part of the case 38. In the latter case, the nozzle 66 should better be located below the case 38.

The second washing section 13 and the third washing section 14 may have similar structure of that of the first washing section 12.

Also, as has been described, the washing tanks 20, 21, 23 and 24 have essentially the same structure. Hence, only the washing tank 20 will be described in detail, with reference to FIG. 6.

As is shown in FIG. 6, the washing tank 20 comprises an inner tank 20a and an outer tank 20b. In the inner tank 20a, semiconductor wafers W can be washed with washing liquid L. The outer tank 20b surrounds the upper rim of the inner tank 20, for receiving the liquid L overflowing the inner tank 20a. A liquid-discharging pipe 81 and liquid-supplying pipes 82 are connected to the bottom of the inner tank 20a and communicate therewith. The liquid L is discharged from the inner tank 20a through the pipe 81, and fresh liquid L is supplied into the inner tank 20a through the pipes 82. As a result, the liquid L in the tank 20a can be renewed and remain clean.

A bubbling pipe 83 is connected to the lower-end portion of the inner tank 20b. Nitrogen gas is jetted through the pipe 83 into the liquid L contained in the inner tank 20a, thereby bubbling or agitating the washing liquid L. The outer tank 20b has a port 95 through which to discharge the washing liquid L.

A washing pipe 85 is located above the washing tank 20. The pipe 85 has a plurality of nozzles 84 which are arranged in, for example, two rows. The pipe 85 is attached to a vertical arm 87. The arm 87 is connected to the shaft 86a of a reversible motor 86, which extends horizontally. When the motor 86 is driven, the arm 87 is rotated in a vertical plane, whereby the nozzles 84 can be placed right above the inner tank 20a and right above the outer tank 20b. To wash the wafers W held in the inner tank 20a, the arm 87 is rotated, bringing the nozzles 84 to the washing position shown in FIG. 6, and the liquid L is applied from the nozzles 84 in the form of spray or shower, onto the surfaces of the semiconductor wafers W. After the wafers W have been washed, the arm 87 is rotated, thus moving the nozzles 84 from the opening of the inner tank 20a to a position right above the outer tank 20b, as is shown in FIG. 7. Hence, the pipe 85 or the arm 87 does not hinder the transport of the wafers W into or out of the inner tank 20a.

The washing liquid L is supplied to the pipe 85 from a washing liquid tank 88 via a liquid-supplying pipe 89 connecting the pipe 84 to the tank 88. The liquid L supplied to the pipe 84 is jetted out through the nozzles 84.

A bypass pipe 90 is connected to the liquid-supplying pipe 89 at both ends. A four-port, two-position valve 91 is mounted on the liquid-supplying pipe 89 and the bypass pipe 90, for selecting the pipe 89 or the bypass pipe 90. A throttle valve 92 is mounted on the bypass pipe 90, for making the liquid L flow through the bypass pipe 90 at a rate lower than the rate at which the liquid L flows through the liquid-supplying pipe 89.

Three liquid-level sensors 93 are mounted on the outer side of the washing liquid tank 88. These sensors 93 are of electrostatic capacitance type and can detect the level of the liquid L in the tank 88, though they do not contact the liquid L at all. Since they do not contact the liquid L, their lifetime is longer than that of liquid-level sensors of any other type, and do not breed bacteria in the washing liquid L. Since the sensors 93 are of electrostatic capacitance type, the washing liquid tank 88 can be made of any non-metal material, so as not to cause the sensors 93 to make errors.

It will now be explained how the wafers W are washed in the washing tank 20, with reference to FIGS. 8A to 8C.

Figure 8A:
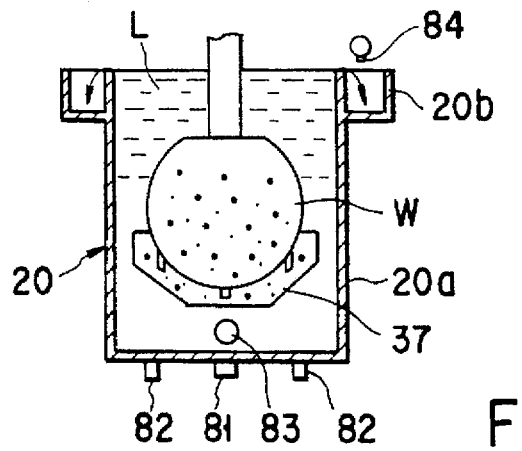
FIGS. 8A, 8B and 8C are diagrams explaining a washing method according to the invention.

First, as is shown in FIG. 8A, the wafers W (e.g., 25 wafers) are vertically held on the parallel rods 37a of the wafer boat 37. The wafer boat 37 is lowered into the washing tank 20, thereby immersing the wafers W in the washing liquid L contained in the tank 20. Next, the hydrogen gas is supplied from a nitrogen gas source (not shown) through the bubbling pipe 83 into the inner tank 20b, thus bubbling or agitating the washing liquid L in the tank 20a. The liquid L is bubbled for a predetermined period of time, washing the wafers W for the first time.

During the first washing of the wafers W, the nozzles 84 are kept above the outer tank 20b, and the liquid L dropping from the nozzles 84 are received in the outer tank 20b. The liquid L may overflow the inner tank 20a as it is bubbled, in which case the overflowing liquid L flows into the outer tank 20b and will be circulated, along with that liquid L fallen from the nozzles 84, by means of a liquid-circulating system (later described).

Figure 8B:
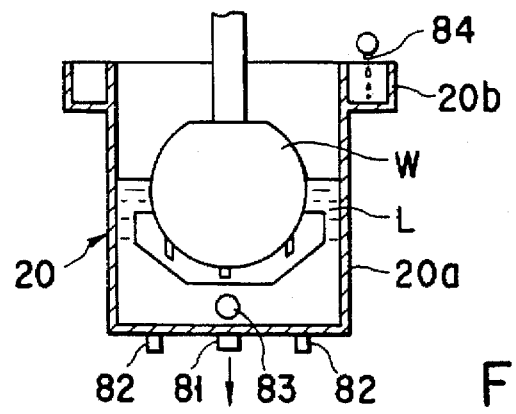

After the first washing of the wafers W, the valve (not shown) provided on the liquid-discharging pipe 81 is opened, thereby discharging the liquid L from the inner tank 20a through the pipe 81, as is shown in FIG. 8B. When the discharging of the liquid L is started, the motor 86 is driven, thereby moving the nozzles 84 to a position above the inner tank 20a. Then, the nozzles 84, now located above the inner tank 20a, sprays pure water onto the wafers W which are exposing gradually exposed as the washing liquid L is discharged from the tank 20a through the pipe 81. The wafers W are thereby washed with the pure water. When the washing liquid L is completely discharged from the inner tank 20a, the valve 91 is switched, thereby introducing fresh washing liquid L into the inner tank 20a through the liquid-supplying pipes 82. Hence, the liquid level in the inner tank 20a rises gradually. When the wafers W are immersed completely in the fresh liquid L, the nozzles 84 stop spraying the pure water.

Figure 8C:
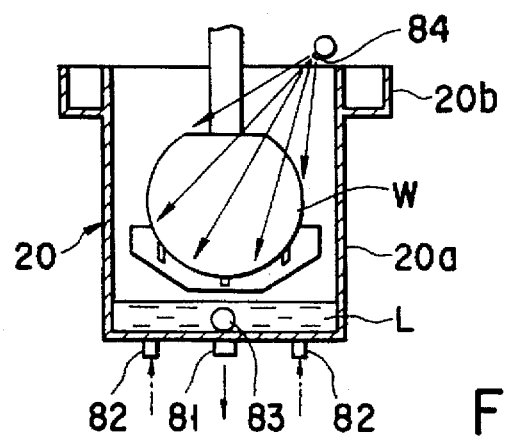

When the inner tank 20a is filled up with the fresh washing liquid L, the motor 86 is driven, moving the nozzles 84 to the position above the outer tank 20a, as is shown in FIG. 8C. This done, hydrogen gas is supplied from the nitrogen gas source via the bubbling pipe 83 into the inner tank 20b, thus bubbling or agitating the washing liquid L in the tank 20a. The liquid L is bubbled for a predetermined period of time, washing the wafers W for the second time.

The wafers W are further washed a prescribed number of times, in the same way as described above.

Since pure water is applied to the wafers W all time the washing liquid L is discharged from the inner tank 20a, they are not exposed to air. Thus, the wafers W are not dried as long as they remain in the washing tank 20, and no stains will be formed on the semiconductor wafers W.

The liquid-circulating system connected to the washing tank 20 will now be described, with reference to FIG. 9.

As is shown in FIG. 9, the outer tank 20b has a liquid-discharging port 95 in its bottom. The port 95 is connected by a pipe 96 to the liquid-supplying port 97 made in the bottom of the inner tank 20a. Hence, the inner tank 20a, the outer tank 20b, and the pipe 96 constitute a closed loop through which the washing liquid L can circulate. A reciprocating pump 98, a damper 99, and a filter 101 are mounted on the pipe 96. The liquid L overflowing the inner tank 20a flows into the outer tank 20b, and is supplied back into the inner tank 20a through the port 95, the pipe 96, and the port 97. The pump 98 promotes the circulation of the liquid L. The damper 99 and the filter 101 cooperate to dampen the pulsations of the liquid L.

More specifically, the reciprocating pump 98 is a bellows pump of the known type; it has a primary port 98a and a secondary port 98b. The pump 98 comprises a hollow cylinder closed at both ends, a fixed partition 108 and two movable partitions 106a and 106b. The partition 108 is located in the middle portion of the hollow cylinder. The movable partition 106a is located on one side of the partition 108 and connected thereto by bellows 105a. The movable partition 106b is located on the other side of the partition 108 and is connected thereto by bellows 105b. The partition 106a, the left end of the hollow cylinder, and the inner surface of the cylinder define a pressure chamber 104a.

Similarly, the partition 106b, the right end of the hollow cylinder, and the inner surface of the cylinder define a pressure chamber 104b. The bellows 105a, the movable partition 106a, and the fixed partition 108 define a liquid chamber 107a. Similarly, the bellows 105b, the movable partition 106b, and the partition 108 define a liquid chamber 107b. The pressure chambers 104a and 104b have air-supplying ports 103a and 103b, respectively, which are connected by a three-port, two-position solenoid valve 102. The solenoid valve 102 is switched, such that compressed air is supplied into the chamber 104a through the port 103a and discharged from the chamber 104b via the port 103b, and vice versa. As a result, the movable partitions 106a and 106b are moved back and forth, while the bellows 105a and 105b are alternately expanded and contracted, respectively. In other words, the liquid chambers 107a and 107b are alternately expanded and contracted, respectively, whereby the liquid L supplied via the primary port 98a is pumped out through the secondary port 98b to the inner tank 20a.

It should be noted that the partitions 108, bellows 105a and 105b, and movable partitions 106a and 106b of the reciprocating pump 98 are made of material which are not corroded by the liquid L, such as fluorine resins.

As can be understood from FIG. 9, the damper 99 is mounted on the pipe 96 and located downstream of the reciprocating pump 98. The damper 99 has a damper chamber 110 and a bellows 111. The damper chamber 110 has an inlet port 99a and an outlet port 99b. The inlet port 99a is connected to the output of the reciprocating pump 98. The outlet port 99b is connected to the input of the filter 101. The bellows 111 is contained in the damper chamber 110, partitioning the chamber 110 into a liquid chamber 110a and a back-pressure chamber 110b. It is made of material which has such a modulus of elasticity that it can move, following the pulsations of the liquid L flowing via the pipe 96. The back-pressure chamber 110b is connected to a compressed air source 113 by means of a changeover solenoid valve 112 and a pipe 114. The compressed air is supplied into the chamber 110b from the source 113 through a flow-rate adjusting valve 115 mounted on the pipe 114 and then through the solenoid valve 112 connected to the damper 99. Hence, a back pressure is applied onto the bellows 111, thereby dampening the flow pulsations of the liquid L.

Figure 10:
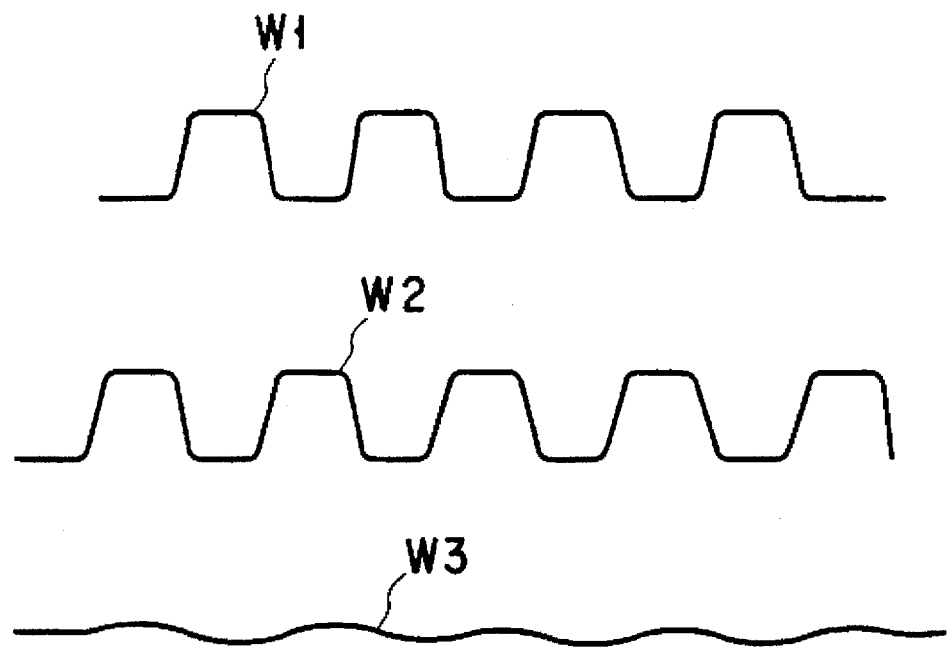
FIG. 10 is a timing chart, explaining how a back pressure is controlled in the system shown in FIG. 9.

The solenoid valve 112 operates in synchronism with the solenoid valve 102. In other words, it is driven by the signals supplied from the solenoid valve 102 and applies a back pressure to the bellows 111 at such timing as to cancel out the flow pulsations of the liquid L, which have been caused by the reciprocating pump 98. More specifically, the valve 112 applies a back pressure varying as is indicated by the waveform W2 shown in FIG. 10, which is substantially identical in amplitude and substantially opposite in phase to the waveform W1 (FIG. 10) indicating the flow pulsations of the liquid L. The flow pulsations of the liquid L supplied from the damper 99 is therefore almost nil as can be understood from the waveform W3 shown in FIG. 10.

In the liquid-circulating system described above, the washing liquid L overflowing into the outer tank 20b flows through the pipe 96, cleaned by the filter 101, and supplied back into the inner tank 20a. In the process, the damper 99 dampens the flow pulsations (waveform W1) of the liquid L which have been caused by the reciprocating pump 98, by applying the back pressure (waveform W2) onto the bellows 111. In other words, when the flow rate of the liquid L from the pump 98 is high, the bellows 111 expands such that the liquid chamber 110a temporarily stores the excessive portion of the liquid L; conversely, when the flow rate of the liquid L is low, the bellows 111 contracts such that the excessive portion of the liquid L is expelled from the liquid chamber 110a into the pipe 96. This is why the damper 99 effectively dampens the flow pulsations of the washing liquid L.

The filter 101 therefore receives virtually no impacts as the washing liquid L passes through it, and has practically no risk of being damaged or worn. Nor is there no chance for dust stuck to the filter 101 to mingle into the liquid L. In addition, since the liquid L flows stably into the inner tank 20a, it does not vibrate the wafers W in the tank 20a, ensuring uniform washing of the wafers W.

As has been stated earlier, the washing liquid L in the tank 20a is bubbled, thereby promoting the washing of the wafers W. If the liquid L is bubbled too vigorously, the wafers W may float or move in the liquid L. According to the invention, the washing tank 20 can be equipped with a mechanism designed to prevent the wafers W from floating or moving. Such a mechanism will be described, with reference to FIG. 11 which is a perspective view showing the washing tank 20 and the mechanism 120 for preventing the wafers W from floating in the washing liquid L.

Figure 11:
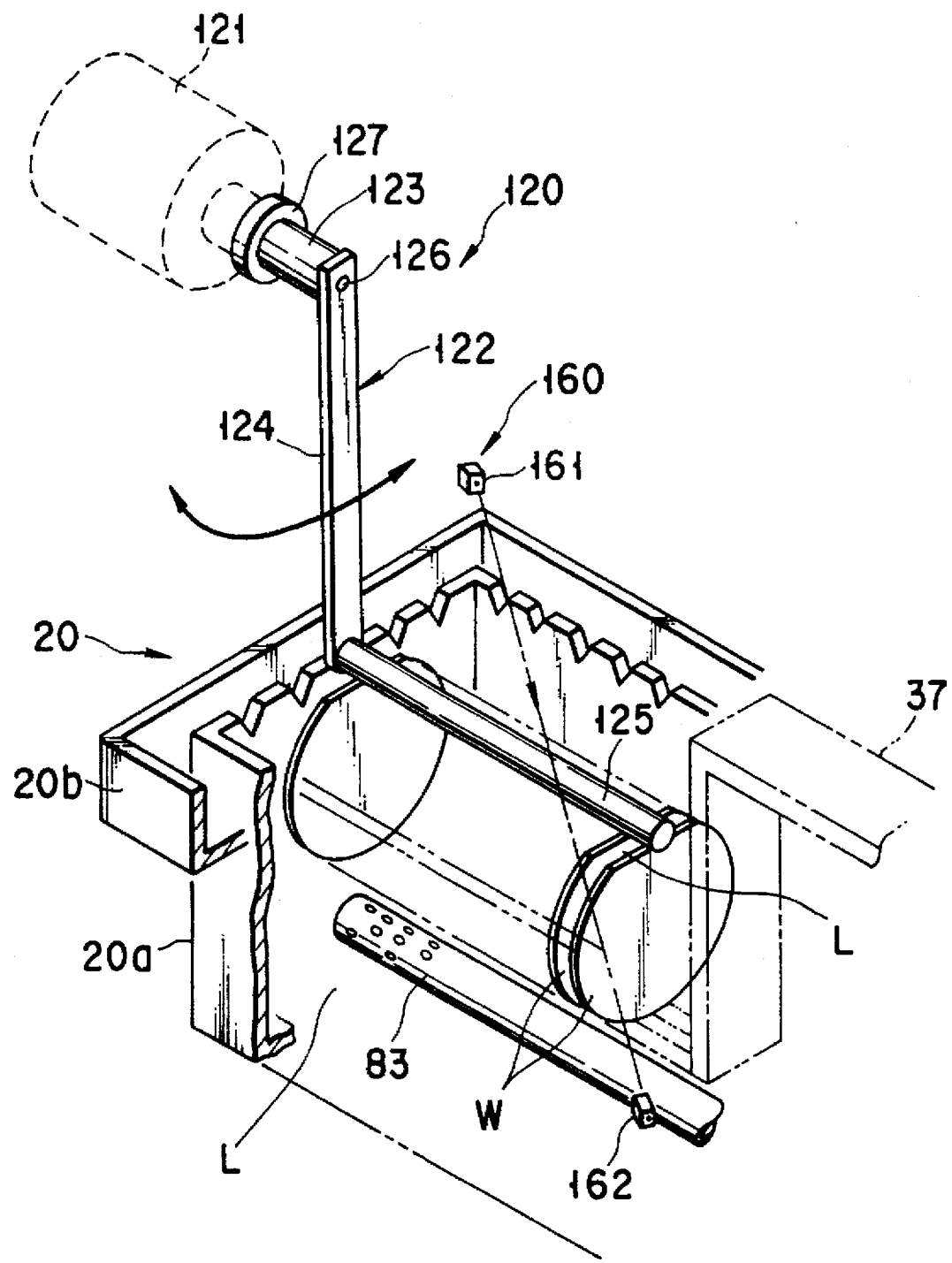
FIG. 11 is a perspective view showing a washing tank having a mechanism for preventing wafers from floating.

As is shown in FIG. 11, the mechanism 120 is arranged above the washing tank 20. The mechanism 120 comprises a rotary actuator 121, a movable member 122, and a floating-preventing member 125. The actuator 121 is located outside the tank 20, for driving the movable member 122. The movable member 122 is coupled to the drive shaft 121a of the rotary actuator 121 and extends downwards from shaft 121a; it rotates in a vertical plane when driven by the rotary actuator 121. The floating-preventing member 125 is connected to the lower end of the movable member 122a and extends horizontally. As the actuator 121 rotates the movable member 122 through 90°, the member 125 is moved between a standby position outside the tank 20 and a operating position where it touches the tops of the wafers W vertically held in the wafer boat 37, thereby preventing the wafers W from floating in the washing liquid L contained in the inner tank 20a. The wafers W are held in the boat 37, with their orientation flats F located highest. It is while the member 125 remains in the standby position that the wafer boat 37 holding the wafers W is brought into the inner tank 20a. A photosensor 160, which comprises a light-emitting element 161 and a light-receiving element 162, is located above the washing tank 20, for detecting the presence or absence of the wafers W in the tank 20.

Figure 12:
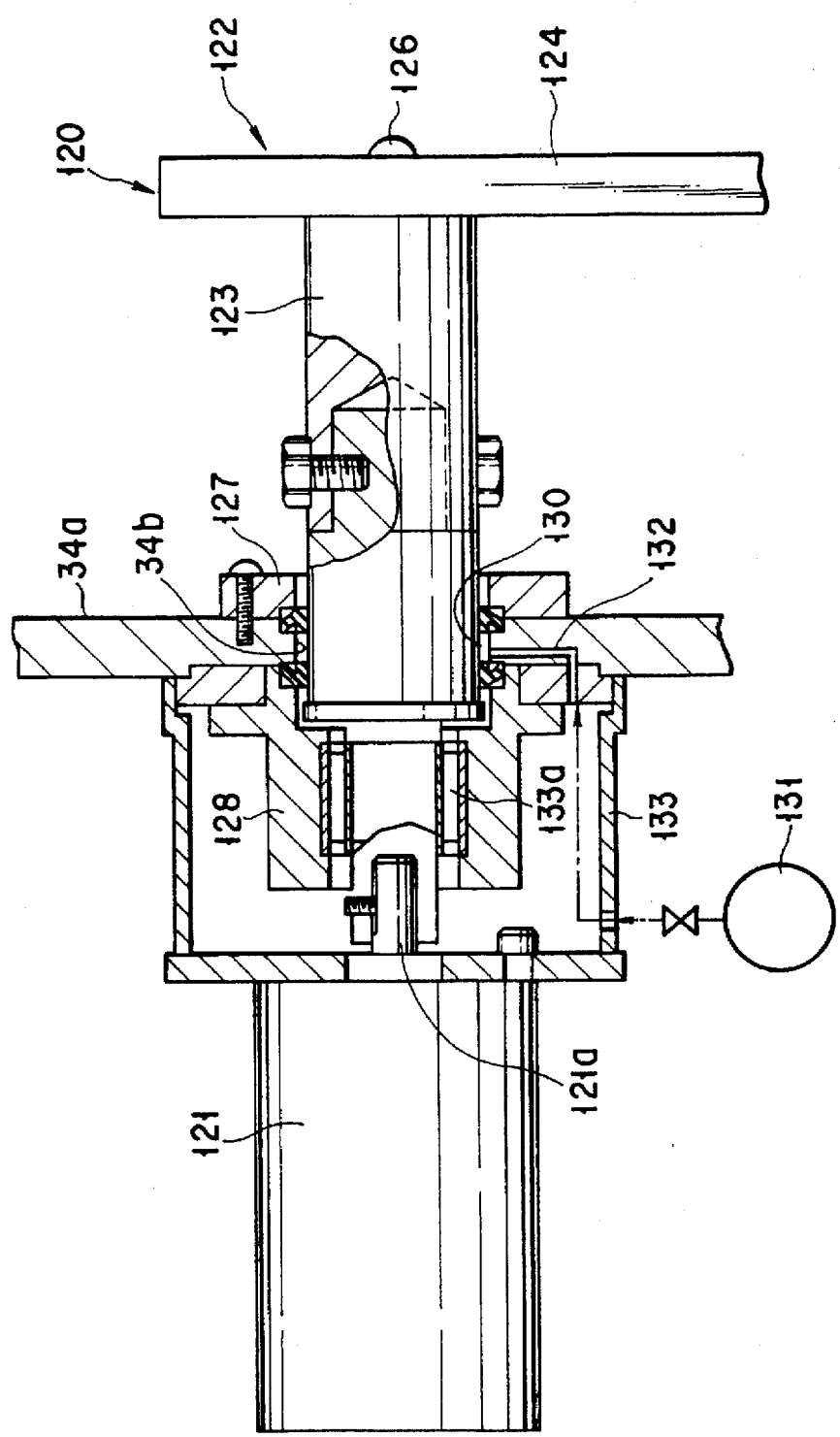
FIG. 12 shows the seal mechanism used in the washing tank shown in FIG. 11.

As is shown in FIG. 12, the movable member 122 comprises a shaft 123 and an arm 124. The shaft 123 is connected to the drive shaft 121a of the rotary actuator 121 located outside the process chamber 34, is positioned coaxial with the drive shaft 121a, and extends into the process chamber 34 through the hole 34b made in the wall 34a of the chamber 34. The arm 124 is fastened at one end to the shaft 123 by means of a screw 126. In the chamber 34, the shaft 123 is surrounded by the holder 127 which is fastened to the wall 34a by screws. Outside the chamber 34, the shaft 123 is surrounded by a housing 128 made of aluminum. Two annular seal members 129 are mounted on the shaft 123 and spaced apart from each other for a predetermined distance. The first seal member 129 is clamped between the wall 34a and the holder 127, and the second seal member 129 between the wall 34a and the housing 128. A sealed space 130 is formed between these seal members 129. The space 130 is connected to a nitrogen gas tank 131. Nitrogen gas is supplied from the tank 131 into the sealed space 130. The pressure within the space 130 is therefore high enough to prevent liquids from leaking from the process chamber 34 into the rotary actuator 121, and dust from entering the chamber 34 from the rotary actuator 121.

As is shown in FIG. 12, too, the drive shaft 121a and the housing 128 are surrounded by a cylindrical cover 133 which is connected at one end to the wall 34a and at the other end to the actuator 121. A bearing 133a is fitted in the housing 128, and holds the shaft 123 rotatably.

The floating-preventing member 125 is a rod made of anti-corrosion material such as polyether ketone (PEEK). The member 125 is located slightly above, for example 1 mm above, the orientation flats F of the wafers W held in the wafer boat 37, as long as the wafers W are immersed in the washing liquid L contained in the inner tank 20a. When the wafers 20 move up as the liquid L bubbled by the nitrogen gas jetted from the bubbling pipe 83, their orientation flats F abut on the floating-preventing member 125, and are thus prevented from floating.

The floating-preventing member 125 can be located in contact with the orientation flats F of the wafers W all the time the wafers W are immersed in the washing liquid L in the inner tank 20a. To place the member 125 so, it suffices to position the axis of the shaft 123 slightly lower along the vertical line passing the center of the wafers W. Hence, the member 125 can touch the orientation flats F of the wafers W before it reaches its lower dead point. It is desirable that a pressure sensor (not shown) detect the pressure the wafers W apply to the member 125, and that the actuator 121 be driven by the signal output by the pressure sensor and representing the pressure thus detected.

The floating-preventing member 125 is not limited to a rod. It can be a plate-shaped one 135 as is shown in FIG. 13. The floating-preventing member 135 has a number of small holes 136, grooves 137 cut in the lower surface and extending lengthwise of the member 135, and fin-shaped strips 138 partly fitted in the grooves 137. The strips 138 are made of flexible, anti-corrosion material such as fluorine-based rubber, and effectively serve to prevent the wafers W from floating upwards.

Since the wafers W are prevented from floating by the member 125, they can be spaced apart at shorter intervals than otherwise. Therefore, more wafers W can be washed at a time than if the member 125 were not being used. Further, the parallel rods 37a of the wafer boat 37 can be arranged densely by virtue of the member 125, which would help to enhance the efficiency of washing the semiconductor wafers W.

With reference to FIG. 14, another type of a mechanism 140 for preventing wafers W from floating will be described, wherein a movable member and a floating-preventing member are linearly moved between a standby position and an operating position.

As is clearly seen from FIG. 14, the system 140 comprises a rod-less cylinder 141, a guide rail 142, a crank-shaped connector 143, a movable member 144, a floating-preventing member 145, and a control section 148. The rod-less cylinder 141, used as drive means, is slidably mounted on the guide rail 142 which is located outside the process chamber 34 and which extends vertically. The connector 143 is fastened to the cylinder 141 at one end. The movable member 144, which is a vertical rod, is secured to the other end of the connector 144. The floating-preventing member 145 is attached to the lower end of the movable member 144. Hence, when the cylinder 141 is moved along the guide rail 142, the floating-preventing member 145 is moved linearly.

A projection 146 protrudes from the rod-less cylinder 141. A pressure sensor 147 is fixed in place, right below the projection 146. The sensor 147 is so positioned that the projection 146 abuts on it the moment the cylinder 141 moves, bringing the floating-preventing member 145 into contact with the wafers W held within the washing tank 20 set in the process chamber 34. When the projection 146 abuts on the pressure sensor 147, the sensor 147 generates and outputs a control signal to a control section 148. In response to the signal, the section 148 stops the cylinder 141 moving on the guide rail 142. The pressure the member 145 exerts on the wafers W is thereby controlled.

The movable member 144 extends through a hole made in the top wall 34a of the process chamber 34. Fitted in this hole is a seal mechanism 150. As is shown in FIG. 15, the mechanism 150 comprises a hollow cylinder 151 and two annular seal members 152. The cylinder 151 is fitted in the hole of the top wall 34a. Both seal members 152 are fitted in the cylinder 151, positioned coaxial to each other and spaced apart from each other. The movable member 144 extends vertically through the annular seal members 152. The member 144, the cylinder 151 and the seal members 152 define an annular space 153. The hollow cylinder 151 has a hole 154, through which nitrogen gas is supplied into the annular space 153 from the nitrogen gas source 155 (FIG. 14) which supplies nitrogen gas into the inner tank 20a for bubbling the washing liquid L contained therein. The gas pressure in this space 153 is high enough to prevent a process liquid from leaking from the process chamber 34 and dust from entering into the process chamber 34. A nitrogen gas source other than the source 155 can be provided for supplying nitrogen gas into the annular space 153.

The transport unit 200 of the washing system shown in FIG. 1 will now be described, with reference to FIGS. 16, 17, and 18. In the description which follows, any carrier for transporting wafers to and from a transfer station 174 (later described) will be called "carrier C," and any carrier for transporting wafers from the section 174 to the washing unit 100 and vice versa will be called "carrier D."

Figure 16:
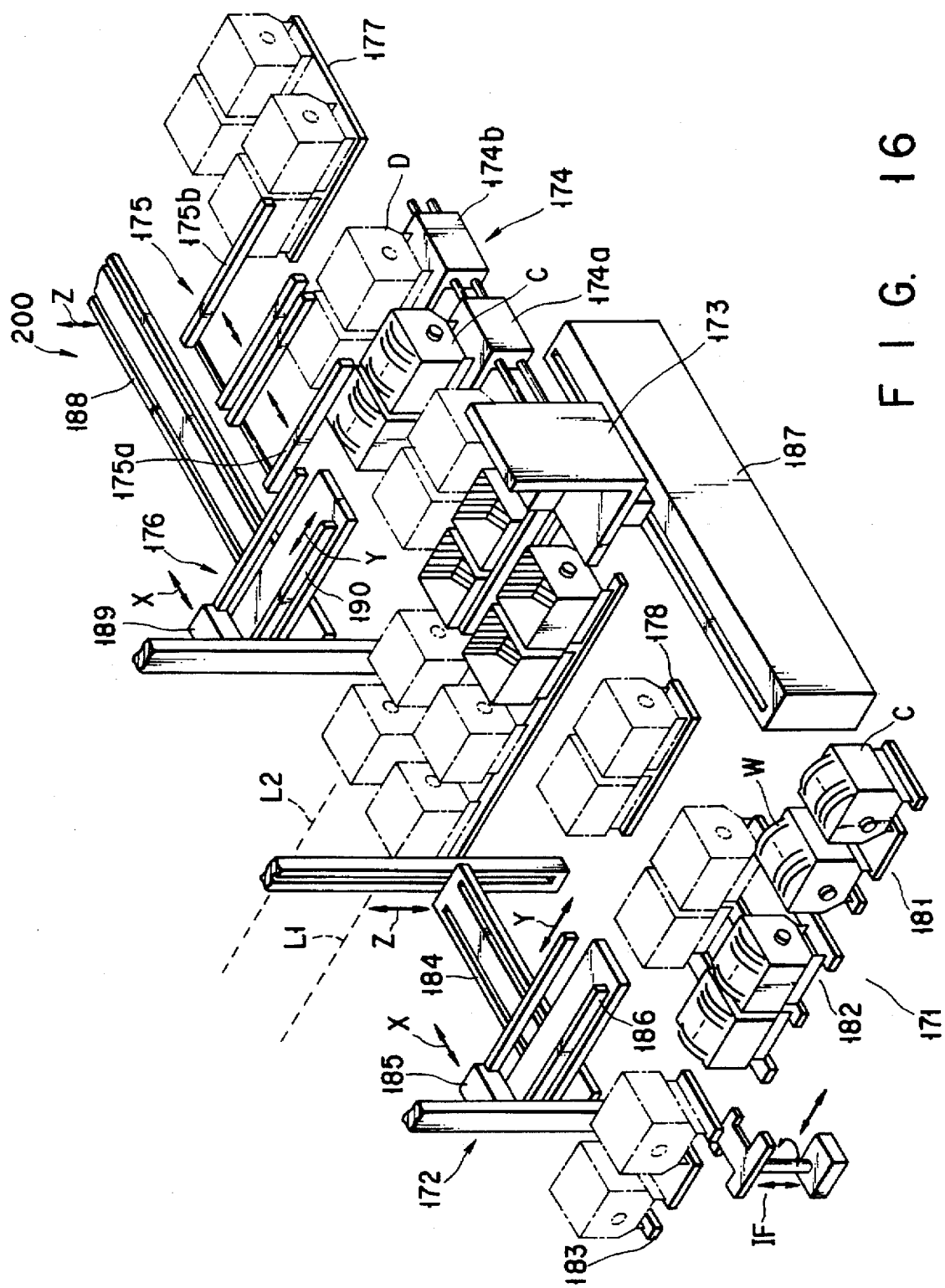
FIG. 16 is a perspective view illustrating the transport unit incorporated in the washing system of FIG. 1.

As is shown in FIG. 16 which is a perspective view of the transport unit 200, the unit 200 comprises a loading/unloading station 171, a first carrier-driving mechanism 172, a robot 173, a transfer station 174, a wafer-holding section 175, a second carrier-driving mechanism 176, and a wafer-transferring section 177. In the loading/unloading station 171, wafer carriers C, each containing semiconductor wafers W, are transported from a wafer storage (not shown) and back thereto. The station 171 comprises a loading section 181, a transfer section 182, and an unloading section 183. At the loading section 181, the carriers C are transported from the wafer storage to the transfer section 182. At the transfer section 182, the carriers C are transferred to and from the first carrier-driving mechanism 172. At the unloading section 183, the carriers C are transported from the transfer section 182, back to the wafer storage. An interface robot IF is located below the line connecting the loading section 181 and the unloading section 183. The robot IF has a hand which can move up and down and rotate around a vertical axis. The robot IF transfers the carriers C among the stations 181, 182, and 183.

The loading/unloading station 171 will be described in greater detail, with reference to FIG. 17 which is a plan view of the section 171.

Figure 17:
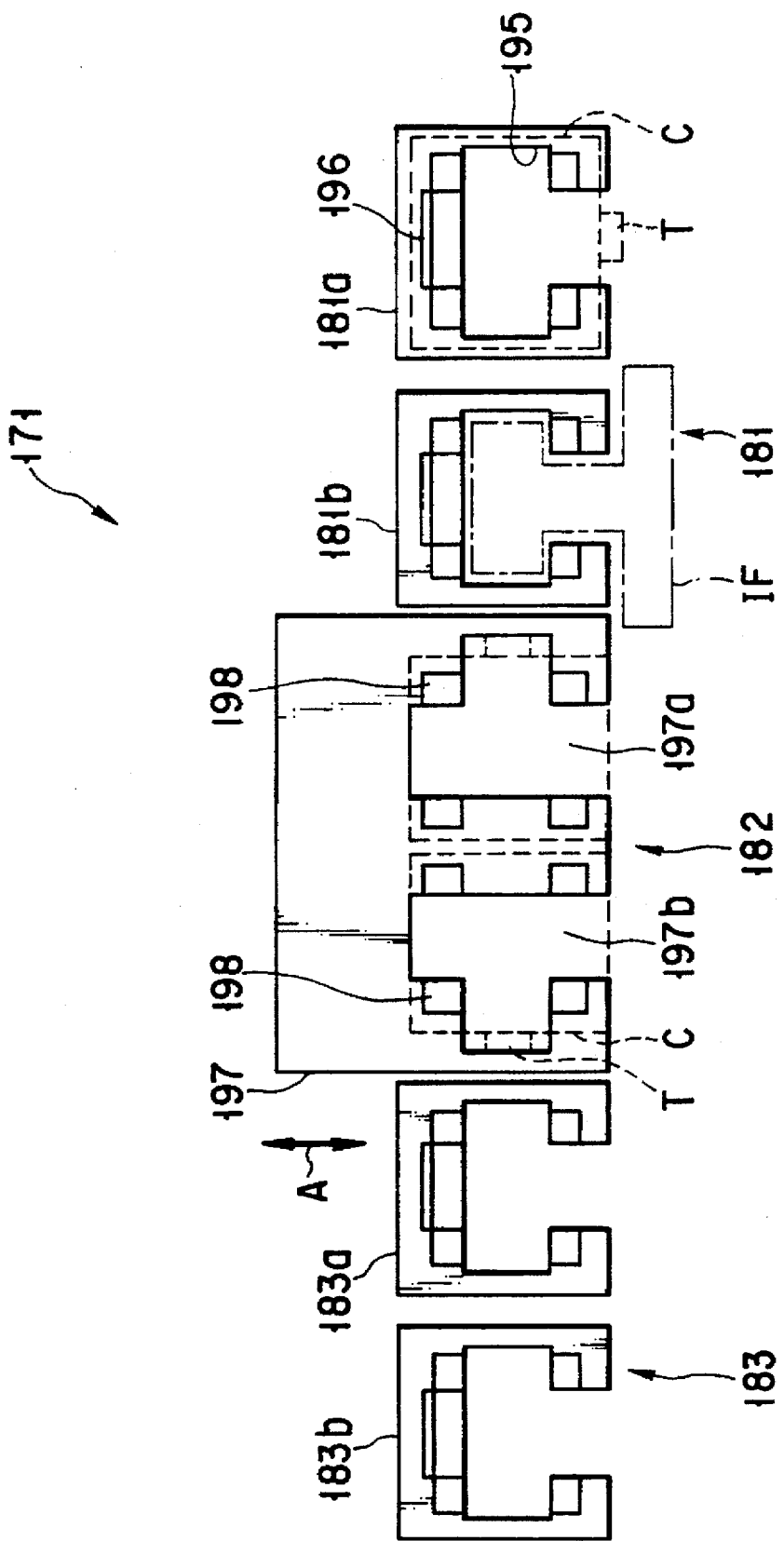
FIG. 17 is a plan view of the loading/unloading station used in the transport unit.

As is evident from FIG. 17, the loading section 181 has two stages 181a and 181b, and the unloading section 183 has also two stages 183a and 183b. These stages 181a, 181b, 183a, and 183b can support two carriers C each. Each stage has a notch which makes it easy for the interface robot IF to place the carrier C on the stage.

A projection 196 protrudes from the back of each stage, so that the carrier C has its handle T automatically directed in the directions shown in FIG. 16, when it is mounted on the stage.

The transfer section 182 has a stage 197 which can move in the directions of arrow A. The stage 197 has guides 198 for positioning two carriers C on the stage 197, with their handles T facing away from each other so that the carriers C occupies the least area possible. The stage 197 also has notches 197a and 197b, which make it easy for the interface robot IF to place the carriers C on the stage 197.

As is shown in FIG. 16, the first carrier-driving mechanism 172 comprises a base 184, a movable member 185, and a pair of arms 186. The base 184 can move up and down, or in the directions of arrow Z. The member 185 can move in the directions of arrow X. The arms 186 can move in the directions of arrow Y. The arms 186 hold a carrier C and moves it from the stage 197 of the transfer section 182, while the stage 197 remains at its downstream position.

The robot 173 is located, facing the first carrier-driving mechanism 172. The robot transport 173 can slide on a guide 187, in the directions of arrow X, for transferring the carriers C to and from the first carrier-driving mechanism 172, with the assistance of an intermediate stage 178.

Arranged downstream of the first carrier-driving mechanism 172 are conveyers L1 and L2. The conveyer L1 conveys empty carriers C to a carrier-washing apparatus (not shown). The conveyer L2 conveys washed carriers C from the carrier-washing apparatus. These empty carriers C have been transported from the transfer station 174, where the wafers W to be washed were transferred into the carrier D.

The transfer station 174 comprises two transfer stages 174a and 174b which can move in the directions of arrow X. A wafer holder 175 having two wafer-holding arms 175a and 175b is arranged above the transfer station 174.

As is shown in FIG. 18, two wafer-pushing mechanisms 193 and 194 are located below the transfer stages 174a and 174b, respectively. The mechanism 193 has a wafer-pushing member 193a and a lift 193b, and is designed to push upwards the wafers W put on the transfer stage 174a. Similarly, the mechanism 194 has a wafer-pushing member 194a and a lift 194b, and is designed to push upwards the wafers W put on the transfer stage 174b. The wafers W pushed up are held by the wafer-holding arms 175a and 175b of the wafer holder 175.

Preferably, the transfer stage 174a, the wafer-pushing mechanism 193, and the arm 175a are used for only the carriers C and the wafers W therein, and the transfer stage 174b, the wafer-pushing mechanism 194, and the arm 175b are used for only the carriers D and the wafers W therein. This prevents cross contamination between any carrier C and any carrier D, and also cross contamination between any wafer W to be washed and any wafer W already washed.

The wafers W are transferred from the carrier C to the carriers D in the following manner. First, the first carrier-driving mechanism 172 transfers the carriers C containing wafers W, which are to be washed, from the transfer section 182 onto the robot 173. The robot 173, now holding the carriers C, moves to the transfer stage 174a and transfers them onto the stage 174a. Next, the transfer stage 174a is moved to a position below the arm 175a. At this position, the wafer-pushing mechanism 193 pushes up the wafers W until the arm 175a holds the wafers W. The wafer-pushing member 193a of the mechanism 193 is lowered. Next, the transfer stage 174a, now supporting the empty carriers C, is moved back to the position where it received the carriers C from the robot 173. The empty carriers C are moved onto the conveyer L1 and conveyed thereby to the carrier-washing apparatus (not shown), which washes the empty carriers C.

Thereafter, the transfer stage 174b holding empty carriers C is moved to the position below the arm 175a. At this position, the wafer-pushing member 183a of the mechanism 193 pushes up the wafers W, whereby the wafers W are transferred from the arm 175a to the transfer stage 174a. The member 183a is lowered, thus placing the wafers W in the empty carriers D mounted on the transfer stage 174a.

Conversely, to transport wafers W, already washed, to the unloading section 183, the carriers D containing the washed wafers W are put on the transfer stage 174b. Then, the wafer-pushing mechanism 194 pushes the wafers W upwards, whereby the wafers W are held by the arm 175a. Meanwhile, empty carriers C, already washed, are mounted on the transfer stage 174b. This stage 174a is moved to a position below the arm 175a, where the wafer-pushing member 194a of the mechanism 194 pushes the wafers W upwards, whereby the wafers W are transferred from the arm 175b into the washed carriers C placed on the stage 174b.

The second carrier-driving mechanism 176 is located, facing the transfer station 174. The mechanism 176 comprises a base 188, a movable member 185, and a pair of arms 190. The base 188 can move up and down, or in the directions of arrow Z. The member 185 can move above the base 188, in the directions of arrow X. The arms 190 extend parallel to each other, and can move in the directions of arrow Y. Hence, the mechanism 179 can transfer carriers D containing wafers W which are to be washed or already washed, between the transfer station 174 and the wafer-transferring section 177.

It will now be explained how the washing system of FIG. 1 operates to wash semiconductor wafers.

At first, carriers C, each containing wafers W to be washed, are transported to the loading section 181 of the transport unit 200. The carriers C are transported from the section 181 to the transfer station 174 through the transfer section 182, by means of the first carrier-driving mechanism 172 and the robot 173. In the station 174, the wafers W are transferred from the carriers D to the washing unit 100. The second carrier-driving mechanism 176 also transports the carriers C, now empty, to the wafer-transferring section 177.

The robot (not shown) installed in the washing unit 100 conveys the carriers D, two at a time, from the wafer-transferring section 177 to the carrier-holding stage of the loader 15 incorporated in the washing unit 100. The wafer-aligning mechanism (not shown) of the loader 15 aligns the wafers W in both carriers D placed on the carrier-holding stage, such that the orientation flats F are positioned highest. Next, the wafers W, for example 50 wafers, are pushed up, out of the carrier D, and transferred onto the fork 41 attached to the free end of the arm 40. The arm 40 is moved away from the loader 15 to the transport chamber 31 of the first washing section 12, thereby transporting the wafers W to the transport chamber 31.

Next, the arm 40 is rotated and expanded, positioning the fork 41 in front of the window 35 of of the process chamber 34 and also aligning the fork 41 with the wafer boat 37 located in the tank 21. This done, the shutter 36 is opened. The arm 40 is moved into the washing tank 21, thus moving the fork 41 into the boat 37. As a result, the wafers W are mounted on the boat 37. The arm 40 is pulled out of the chamber 34 through the window 35; the fork 41 is also moved out of the chamber 34. Thereafter, the shutter 36 is closed, and the wafer boat 37 is lowered until the wafers W are immersed in the ammonia water contained in the washing tank 21.

Upon lapse of a prescribed time, the wafers W are pulled up out of the ammonia water. Then, the window 35 is opened, and the fork 41 is brought into the process chamber 34 and lowered in the tank 21. The wafers W, washed with the ammonia water, are mounted on the fork 41. The fork 41 is moved from the chamber 34 through the window 35, thus returning the wafers W into the transport chamber 31.

Then, the arm 40 is rotated and expanded, such that the fork 41 holding the wafers W is positioned in front of the window 35 of the process chamber 34 containing the water-washing tank 20. The shutter of 36 is opened, and the fork 41 is inserted into the tank 20 through the window 35. The wafers W are transferred from the fork 41 onto the wafer boat 37. The boat 37 is lowered until the wafers W are immersed in the water contained in the tank 20.

Upon lapse of a predetermined time, the boat 37 is pulled out of the water. The wafers W, water-washed, are transferred from the boat 37 onto the fork 41. The arm 40 is rotated, thereby moving the fork 41 to the underwater loader 17.

The transport mechanism 22 of the second washing section 13 is driven, taking the wafers W from the underwater loader 17 into the transport chamber 32 of the second washing section 13. The wafers W are transferred from the fork 41 onto the wafer boat 37 located above the washing tank 23. The boat 37 is lowered until the wafers W are immersed into the fluoric acid solution filled in the tank 23. Upon lapse of a predetermined time, the boat 37 is lifted, thus taking the wafers W out of the fluoric acid solution. The wafers W are then transferred from the boat 37 onto the fork 41. The fork 41 is moved into the transport chamber 32, thus bringing the wafers W, washed with the fluoric acid solution, into the chamber 32.

Further, the arm 40 is rotated and expanded, positioning the fork 41 right above the water-washing tank 24. The wafers W are then transferred from the fork 41 onto the wafer boat 37 located in the tank 24. The boat 37 is lowered until the wafers W are immersed into the water contained in the tank 24. While the wafers W are being washed with water, the nozzles 84 apply pure water onto the rods 43 of the fork 41, thus removing the residual fluoric acid from the rods 43. Next, the wafers W are transferred from the boat 37 onto the fork 41. The fork 41 is moved from the tank 24 to the underwater loader 18. The fork 41 is lowered into the loader 18, whereby the wafer W are placed within the underwater loader 18.

Thereafter, the transport mechanism 25 of the third washing section 14 transports the wafers W from the underwater loader 18 to the drying tank 27. In the tank 27, the wafers W are dried, by using isopropyl alcohol. The fork 41 of the mechanism 25 takes the wafers W, thus dried, to the carriers D mounted on the unloader 16. The wafers W are placed in the carriers D.

The robot (not shown) transports the carriers D from the unloader 16 to the wafer-transferring section 177 of the transfer unit 200. The second carrier-driving mechanism 176 takes the wafer carriers D from the section 177 to the transfer station 174. At the station 174, the wafers W are transferred from the carriers D to the carriers C which have been washed. The robot 173 and the first carrier-driving mechanism 172 cooperate, transporting the carriers C to the transfer section 182. The carriers C are transported from the section 182 to the unloading section 183, and are hence moved into the wafer storage (not shown).

Thus ends the entire operation of the washing system shown in FIG. 1. It is desirable that all steps of washing wafers W be performed automatically in accordance with programs which run on a computer system.

In the embodiment described above, each wafer boat 37 used is moved up and down. Instead, the wafer boat 37 can be secured to the process tank. Further, the method of opening and closing the shutter 36 is not limited to the one explained above; the shutter 36 can be moved up or slid sideways, to open the window 35 of the process chamber 34. Moreover, the position of the nozzles 66 is not limited to the one specified above; the nozzles 66 can be located at any other position provided it can apply pure water onto the shutter 36. Still further, the shutter 36 can be washed while it is kept immersed in a washing liquid contained in the lower part of the case 38.

According to the present invention, the objects can be washed in each process tank by any method, provided that the objects are immersed during the washing process.

The washing system described above is designed to wash semiconductor wafers W. Nonetheless, the present invention can be applied to apparatuses and methods of washing LCD substrates, printed circuit boards, and the like.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A washing apparatus comprising:
a washing chamber having an opening and designed for washing substrates transported from outside through the opening;
opening/closing means for opening and closing the opening of said washing chamber, wherein said opening/closing means comprises a casing aligned with the opening of said washing chamber, and a shutter slidably inserted in said casing, for opening and closing the opening of said washing chamber, and drive means for driving said shutter between a first position where said shutter opens the opening and a second position wherein said shutter closes the opening; and
washing means for washing a portion of said opening/closing means.

2. The apparatus according to claim 1, wherein said washing means has a nozzle for applying a washing liquid onto said shutter.

3. The apparatus according to claim 1, wherein said casing contains means for forming a downward flow of clean air in said casing.

4. The apparatus according to claim 1, wherein said drive means has a cylinder and a plunger which is movable relative to the cylinder and which is secured to said shutter.

5. The apparatus according to claim 4, further comprising seal means connecting said casing and said plunger together, thereby forming a sealed space.

6. The apparatus according to claim 5, further comprising gas-supplying means for supplying gas into said sealed space.

7. The apparatus according to claim 1, further comprising a transport mechanism located outside said washing chamber, for transporting the substrates into and out of said washing chamber.

8. The apparatus according to claim 7, further comprising a housing containing said transport mechanism.

9. The apparatus according to claim 8, further comprising means for forming a downward flow of clean air in said housing.

10. The apparatus according to claim 1, wherein said washing chamber has a tank filled with washing liquid, and the substrates are washed while immersed in the washing liquid.

11. A washing apparatus according to claim 1, wherein said washing means includes at least one nozzle which directs a washing fluid onto said portion of said opening/closing means.

12. A washing apparatus according to claim 1, wherein said washing means includes a tank containing a washing liquid and supplying said washing liquid to at least one nozzle, and wherein said at least one nozzle is disposed to direct the washing liquid onto said portion of said opening/closing means.

13. A washing apparatus according to claim 1, wherein said opening/closing means includes a vertically oriented shutter.

14. A washing apparatus according to claim 13, wherein said washing means comprises nozzle means for directing a washing fluid upon said vertically oriented shutter in two directions.

15. A washing apparatus according to claim 1, wherein said washing means comprises nozzle means for directing a washing fluid upon said shutter in two directions.

* * * * *